United States Patent
Ha et al.

(10) Patent No.: US 10,521,291 B2
(45) Date of Patent: Dec. 31, 2019

(54) CONTROLLER, SEMICONDUCTOR MEMORY SYSTEM AND OPERATING METHOD THEREOF

(71) Applicants: SK hynix Inc., Gyeonggi-do (KR); Korea Advanced Institute of Science and Technology, Daejeon (KR)

(72) Inventors: Jeong-Seok Ha, Daejeon (KR); Dae-Sung Kim, Gwangju (KR); Su-Hwang Jeong, Jeollanam-do (KR)

(73) Assignees: SK hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 38 days.

(21) Appl. No.: 15/862,812

(22) Filed: Jan. 5, 2018

(65) Prior Publication Data

US 2018/0341543 A1      Nov. 29, 2018

(30) Foreign Application Priority Data

May 26, 2017    (KR) ........................ 10-2017-0064981

(51) Int. Cl.
     *G11C 29/00*      (2006.01)
     *H03M 13/00*      (2006.01)
     (Continued)

(52) U.S. Cl.
     CPC ........ *G06F 11/104* (2013.01); *G06F 11/1012* (2013.01); *G06F 11/1048* (2013.01);
     (Continued)

(58) Field of Classification Search
     CPC ............. G06F 11/1012; G06F 11/1048; G06F 11/104; G06F 11/1068; G11C 11/5642;
     (Continued)

(56) References Cited

U.S. PATENT DOCUMENTS

| 2017/0271031 A1* | 9/2017 | Sharon | ................ G11C 29/42 |
| 2017/0308432 A1* | 10/2017 | Hsiao | ................ G11C 29/021 |
| 2018/0225041 A1* | 8/2018 | Chen | ................ G06F 11/1012 |

FOREIGN PATENT DOCUMENTS

| KR | 1020160073868 | 6/2016 |
| KR | 1020160102738 | 8/2016 |

OTHER PUBLICATIONS

Wang, J. et al., Soft Information for LDPC Decoding in Flash: Mutual-Information Optimized Quantization, 2011, pp. 1-6, 2011 IEEE Global Telecommunications Conference—Globecom 2011, Kathmandu, Nepal.

* cited by examiner

*Primary Examiner* — Christine T. Tu
(74) *Attorney, Agent, or Firm* — IP & T Group LLP

(57) ABSTRACT

An operating method of a controller, comprising: generating, when a first ECC decoding operation to codeword read from a semiconductor memory device according to a hard read voltage fails, an optimization information corresponding the result of the first ECC decoding operation; generating one or more quantization intervals determined by the optimization information; and performing a second ECC decoding operation to codeword read from the semiconductor memory device according to soft read voltages determined by the quantization intervals and the hard read voltage, wherein the optimization information includes: deterioration information of a memory block; ECC decoder parameter information; and constituent code parameter information.

20 Claims, 13 Drawing Sheets

(51) Int. Cl.
*G06F 11/10* (2006.01)
*G11C 16/26* (2006.01)
*H03M 13/37* (2006.01)
*G11C 11/56* (2006.01)
G11C 29/04 (2006.01)
G11C 29/52 (2006.01)
H03M 13/11 (2006.01)
H03M 13/15 (2006.01)
H03M 13/23 (2006.01)
H03M 13/29 (2006.01)

(52) U.S. Cl.
CPC ...... *G06F 11/1068* (2013.01); *G11C 11/5642* (2013.01); *G11C 16/26* (2013.01); *H03M 13/3707* (2013.01); *H03M 13/3715* (2013.01); *H03M 13/6325* (2013.01); *G11C 29/52* (2013.01); *G11C 29/82* (2013.01); *G11C 2029/0411* (2013.01); *H03M 13/1102* (2013.01); *H03M 13/152* (2013.01); *H03M 13/1515* (2013.01); *H03M 13/23* (2013.01); *H03M 13/2957* (2013.01)

(58) Field of Classification Search
CPC ......... G11C 16/26; G11C 29/52; G11C 29/82; G11C 2029/0411; H03M 13/3707; H03M 13/3715; H03M 13/6325; H03M 13/1102; H03M 13/1515; H03M 13/152; H03M 13/23; H03M 13/2957
See application file for complete search history.

<IDEAL>

CONTROLLER, SEMICONDUCTOR MEMORY SYSTEM AND OPERATING METHOD THEREOF

CROSS-REFERENCE TO RELATED APPLICATIONS

The present application claims priority of Korean Patent Application No. 10-2017-0064981, filed on May 26, 2017, which is incorporated herein by reference in its entirety.

BACKGROUND

1. Field

Various exemplary embodiments of the present invention relate to a semiconductor design technology and, more particularly, to a controller, a semiconductor memory system, and an operating method thereof.

2. Description of the Related Art

Semiconductor memory devices are generally classified into volatile memory devices, such as Dynamic Random Access Memory (DRAM) and Static RAM (SRAM), and nonvolatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetoresistive RAM (MRAM), Resistive RAM (RRAM) and flash memory.

Volatile memory devices lose data stored therein when their power supplies are interrupted, whereas nonvolatile memory devices retain data stored therein even when their power supply is interrupted. In particular, flash memory devices are widely used as storage mediums in computer systems due to their high program speed, low power consumption and large data storage capacity.

In nonvolatile memory devices, including flash memory devices, the data state of each memory cell is determined based on the number of bits stored in the memory cell. A memory cell storing 1-bit data per cell is called a single-bit cell or a single-level cell (SLC). A memory cell storing multi-bit data, i.e., 2 or more bit data, per cell is called a multi-bit cell, a multi-level cell (MLC) or a multi-state cell. Multi-bit cells are advantageous for high integration. However, as the number of bits programmed in each memory cell increases, reliability decreases and read failure rates increase.

For example, when k bits are programmed in a memory cell, one of $2^k$ threshold voltages is formed in the memory cell. Due to minute differences between the electrical characteristics of memory cells, the threshold voltages of memory cells programmed with the same data form a threshold voltage distribution. Threshold voltage distributions are therefore based upon memory cells having $2^k$ data values, which corresponds to k-bit information.

However, the voltage window available for threshold voltage distributions is limited. Therefore, as the value k increases, the distance between the threshold voltage distributions must decrease and the adjacent threshold voltage distributions may overlap each other. As the adjacent threshold voltage distributions overlap each other, the data that is read may include multiple error bits.

FIG. 1 is a threshold voltage distribution schematically illustrating program and erase states of a 3-bit multi-level cell (3-bit MLC) nonvolatile memory device.

FIG. 2 is a threshold voltage distribution schematically illustrating program and erase states due to characteristic deterioration of a 3-bit MLC nonvolatile memory device.

In an MLC nonvolatile memory device, e.g., an MLC flash memory device in which k-bit data is programmed in a memory cell, the memory cell may have one of $2^k$ threshold voltage distributions. For example, a 3-bit MLC has one of 8 threshold voltage distributions.

Threshold voltages of memory cells programmed with the same data form a threshold voltage distribution due to characteristic differences between memory cells. In a 3-bit MLC nonvolatile memory device, as illustrated in FIG. 1, threshold voltage distributions having first to seventh program states 'P1' to 'P7' and an erase state 'E' are formed. FIG. 1 shows an ideal case in which threshold voltage distributions do not overlap and have read voltage margins therebetween.

Referring to the flash memory example of FIG. 2, memory cells may experience charge loss over time from the electrons that are lost from the floating gate or tunnel oxide film. This charge loss may accelerate when the tunnel oxide film deteriorates from numerous program and erase operations. Charge loss results in a decrease in the threshold voltages of memory cells. For example, as illustrated in FIG. 2, the threshold voltage distribution may shift to the left as the result of charge loss.

Further, program disturbance, erase disturbance and/or back pattern dependency also cause increases in threshold voltages. As the characteristics of memory cells deteriorate, as described above, threshold voltage distributions of adjacent states may overlap, as illustrated in FIG. 2.

Once threshold voltage distributions overlap, read data may have a significant number of errors when a particular read voltage is applied to a selected word line. For example, when a sensed state of a memory cell according to a read voltage Vread3 (i.e the voltage read from the memory cell) that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when threshold voltage distributions overlap, the memory cell, which actually has the third program state 'P3', may be erroneously determined to have the second program state 'P2'. In short, when the threshold voltage distributions overlap as illustrated in FIG. 2, read data (i.e. data which is read from a memory cell) may include a significant number of errors.

What is therefore required is a scheme for precisely determining optimal read voltages for data stored in memory cells of a semiconductor memory device.

SUMMARY

Various embodiments of the present invention are directed to a controller capable of precisely determining optimal read voltages for data stored in memory cells, a semiconductor memory system, and an operating method thereof.

In accordance with an embodiment of the present invention, an operating method of a controller, comprising: generating, when a first ECC decoding operation to codeword read from a semiconductor memory device according to a hard read voltage fails, an optimization information corresponding the result of the first ECC decoding operation; generating one or more quantization intervals determined by the optimization information; and performing a second ECC decoding operation to codeword read from the semiconductor memory device according to soft read voltages determined by the quantization intervals and the hard read voltage, wherein the optimization information includes: deterioration information of a memory block; ECC decoder parameter information; and constituent code parameter information.

Preferably, the first ECC decoding operation is a hard decision decoding operation, and the second ECC decoding operation is a soft decision decoding operation.

Preferably, the deterioration information of a memory block includes information of P/E cycle and data retention time of the memory block.

Preferably, the ECC decoder parameter information includes a chase decoding parameter.

Preferably, the constituent code parameter information includes information of length and error correction capability of a constituent BCH code.

Preferably, the generating of one or more quantization intervals is performed by generating the one or more quantization intervals by following equation based on the optimization information.

$$\Delta^i = \underset{\Delta^i}{\mathrm{argmax}} \Sigma_{r \in R} p(c \in C_c, r; \Delta^1, \ldots, \Delta^i) \cdot 1_{\Delta'(c,L(r)) \leq T_{ML}(r)} \quad \text{[Equation]}$$

wherein, "$\Delta^i$" represents a quantization interval pair, "i" represents an index of the quantization interval pair, "c" represents an error-corrected codeword, "$C_c$" represents a set of candidate codewords of a chase decoder, "r" represents a channel output of the constituent code, "$\Delta'(c', L(r))$" represents distance between a codeword and log likelihood ratio vector, "L" represents a channel output of a constituent code whose length is "n", and "$T_{ML}$" represents a threshold for determining reliability of the error-corrected codeword.

Preferably, the second ECC decoding operation is performed to the codeword read from the semiconductor memory device according to each of the soft read voltages respectively corresponding to the one or more quantization intervals.

Preferably, the second ECC decoding operation is performed to the codeword read from the semiconductor memory device according to each of the soft read voltages until the second ECC decoding operation succeeds or until an index representing the quantization intervals reaches its maximum value.

In accordance with an embodiment of the present invention, a controller comprising: means for generating, when a first ECC decoding operation to codeword read from a semiconductor memory device according to a hard read voltage fails, an optimization information corresponding the result of the first ECC decoding operation; means for generating one or more quantization intervals determined by the optimization information; and means for performing a second ECC decoding operation to codeword read from the semiconductor memory device according to soft read voltages determined by the quantization intervals and the hard read voltage, wherein the optimization information includes: deterioration information of a memory block; ECC decoder parameter information; and constituent code parameter information.

Preferably, the first ECC decoding operation is a hard decision decoding operation, and the second ECC decoding operation is a soft decision decoding operation.

Preferably, the deterioration information of a memory block includes information of P/E cycle and data retention time of the memory block.

Preferably, the ECC decoder parameter information includes a chase decoding parameter.

Preferably, the constituent code parameter information includes information of length and error correction capability of a constituent BCH code.

Preferably, the means for generating one or more quantization intervals generates the one or more quantization intervals by following equation based on the optimization information.

$$\Delta^i = \underset{\Delta^i}{\mathrm{argmax}} \Sigma_{r \in R} p(c \in C_c, r; \Delta^1, \ldots, \Delta^i) \cdot 1_{\Delta'(c,L(r)) \leq T_{ML}(r)} \quad \text{[Equation]}$$

wherein, "$\Delta^i$" represents a quantization interval pair, "i" represents an index of the quantization interval pair, "c" represents an error-corrected codeword, "$C_c$" represents a set of candidate codewords of a chase decoder, "r" represents a channel output of the constituent code, "$\Delta'(c', L(r))$" represents distance between a codeword and log likelihood ratio vector, "L" represents a channel output of a constituent code whose length is "n", and "$T_{ML}$" represents a threshold for determining reliability of the error-corrected codeword.

Preferably, the means for performing the second ECC decoding operation performs the second ECC decoding operation to the codeword read from the semiconductor memory device according to each of the soft read voltages respectively corresponding to the one or more quantization intervals.

Preferably, the means for performing the second ECC decoding operation performs the second ECC decoding operation to the codeword read from the semiconductor memory device according to each of the soft read voltages until the second ECC decoding operation succeeds.

In accordance with an embodiment of the present invention, A semiconductor memory system comprising: a semiconductor memory device; and a controller, wherein the controller includes: means for generating, when a first ECC decoding operation to codeword read from a semiconductor memory device according to a hard read voltage fails, an optimization information corresponding the result of the first ECC decoding operation; means for generating one or more quantization intervals determined by the optimization information; and means for performing a second ECC decoding operation to codeword read from the semiconductor memory device according to soft read voltages determined by the quantization intervals and the hard read voltage, and wherein the optimization information includes: deterioration information of a memory block; ECC decoder parameter information; and constituent code parameter information.

Preferably, the first ECC decoding operation is a hard decision decoding operation, and the second ECC decoding operation is a soft decision decoding operation.

Preferably, the means for generating one or more quantization intervals generates the one or more quantization intervals by following equation based on the optimization information.

$$\Delta^i = \underset{\Delta^i}{\mathrm{argmax}} \Sigma_{r \in R} p(c \in C_c, r; \Delta^1, \ldots, \Delta^i) \cdot 1_{\Delta'(c,L(r)) \leq T_{ML}(r)} \quad \text{[Equation]}$$

wherein, "Δ$^i$" represents a quantization interval pair, "i" represents an index of the quantization interval pair, "c" represents an error-corrected codeword, "$C_c$" represents a set of candidate codewords of a chase decoder, "r" represents a channel output of the constituent code, "Δ'(c', L(r))" represents distance between a codeword and log likelihood ratio vector, "L" represents a channel output of a constituent code whose length is "n", and "$T_{ML}$" represents a threshold for determining reliability of the error-corrected codeword.

In accordance with an embodiment of the present invention, a memory system comprising: memory blocks; and a controller suitable for: generating, when a hard decision decoding operation to codeword read from the memory blocks according to a hard read voltage fails, an optimization information corresponding a result of the hard decision decoding operation; generating one or more quantization intervals determined by the optimization information; and performing a soft decision decoding operation to codeword read from the memory blocks according to soft read voltages determined by the quantization intervals and the hard read voltage, wherein the optimization information includes: information of PIE cycle and data retention time of the respective memory blocks; a chase decoding parameter; and information of length and error correction capability of a constituent BCH code.

DETAILED DESCRIPTION

Figure 1:
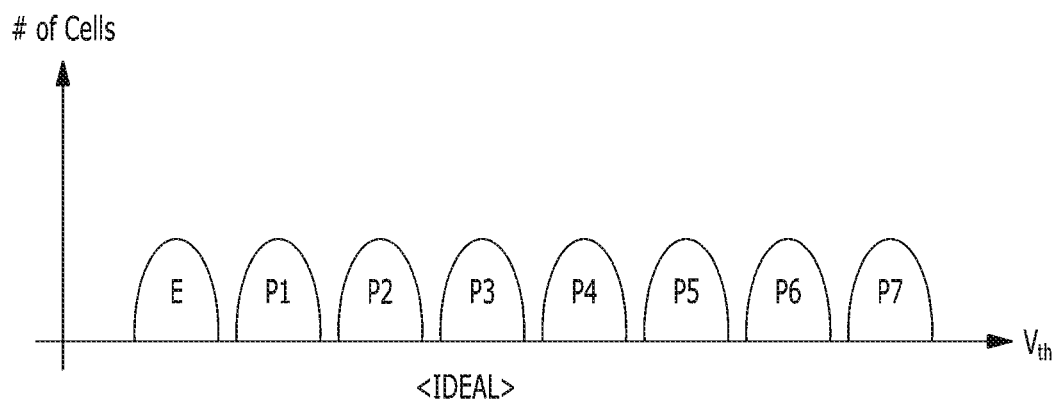
FIG. 1 is a threshold voltage distribution schematically illustrating program and erase states of a 3-bit multi-level cell (3-bit MLC) nonvolatile memory device.
Figure 2:
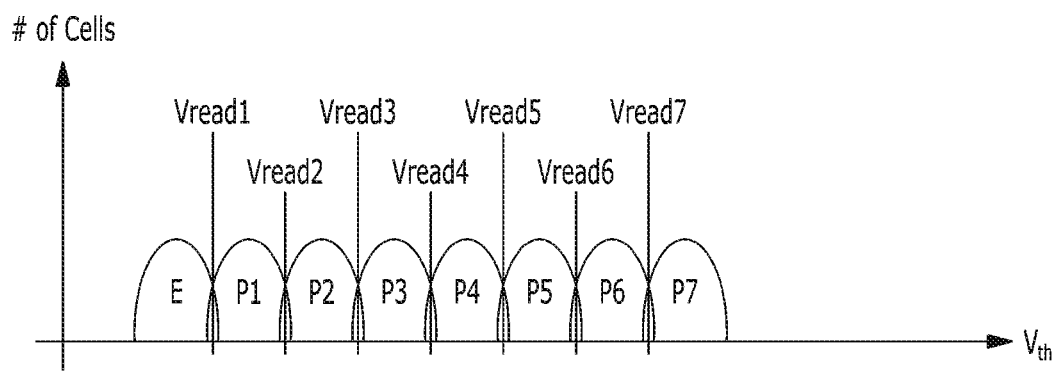
FIG. 2 is a threshold voltage distribution schematically illustrating program and erase states due to characteristic deterioration of a 3-bit MLC nonvolatile memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and, in some instances, proportions may have been exaggerated in order to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to where the first layer is formed directly on the second layer or the substrate but to where a third layer exists between the first layer and the second layer or the substrate.

Figure 3:
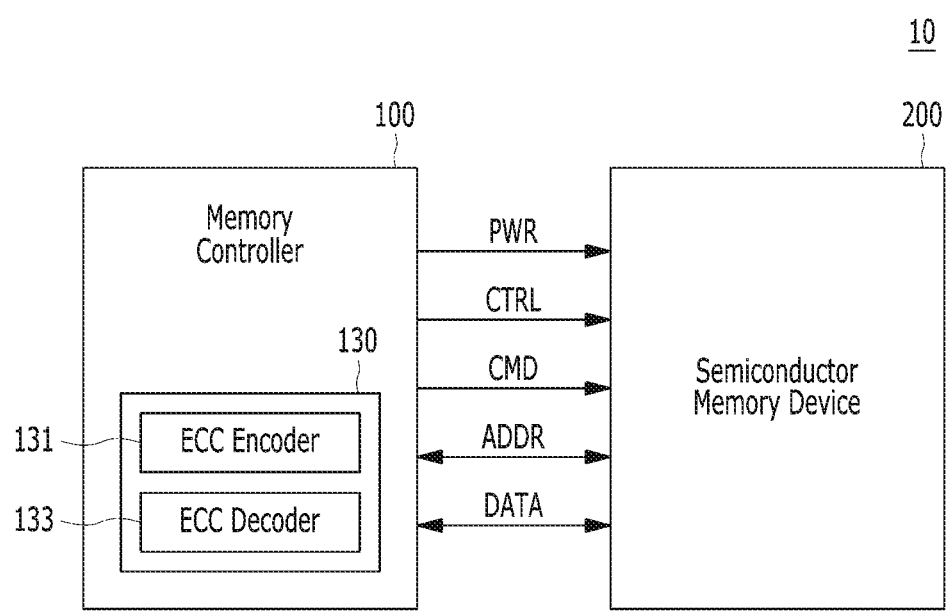
FIG. 3 is a block diagram schematically illustrating a semiconductor memory system in accordance with an embodiment of the present invention.

FIG. 3 is a block diagram schematically illustrating a semiconductor memory system 10 in accordance with an embodiment of the present invention.

Figure 4A:
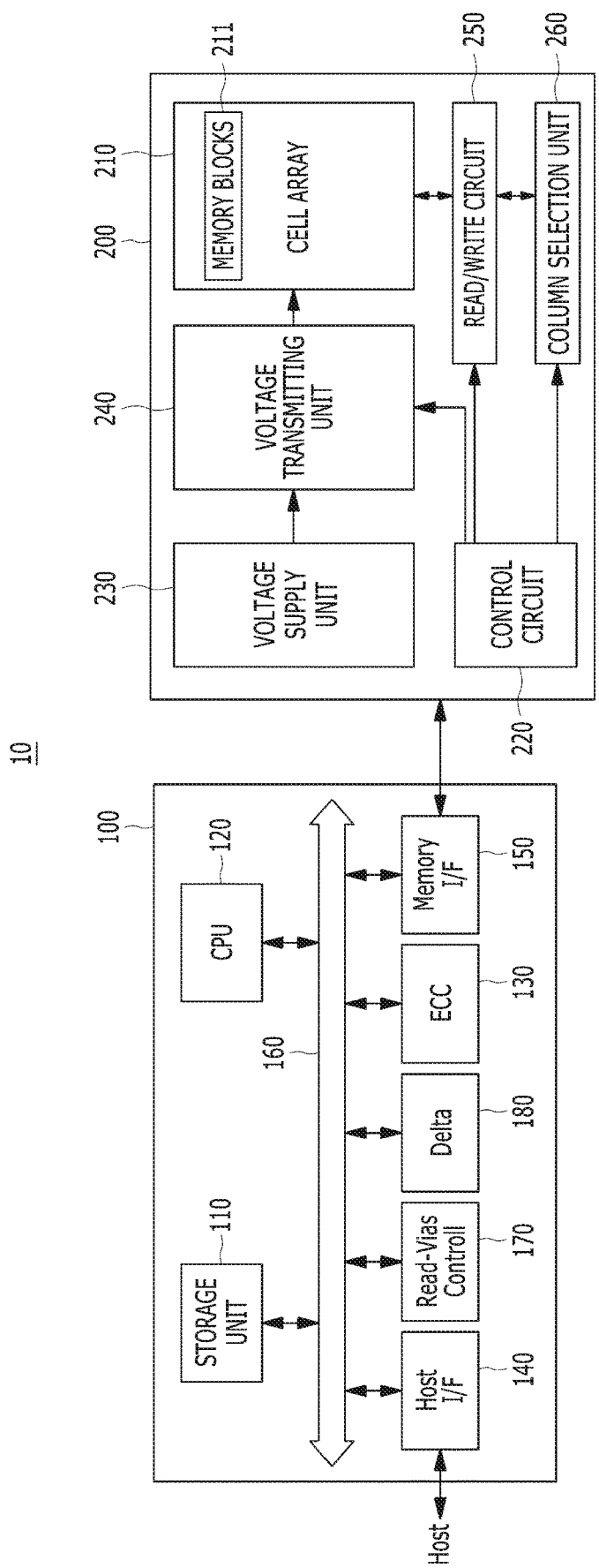
FIG. 4A is a detailed block diagram illustrating the semiconductor memory system shown in FIG. 3.

FIG. 4A is a detailed block diagram illustrating the semiconductor memory system 10 shown in FIG. 3.

Figure 4B:
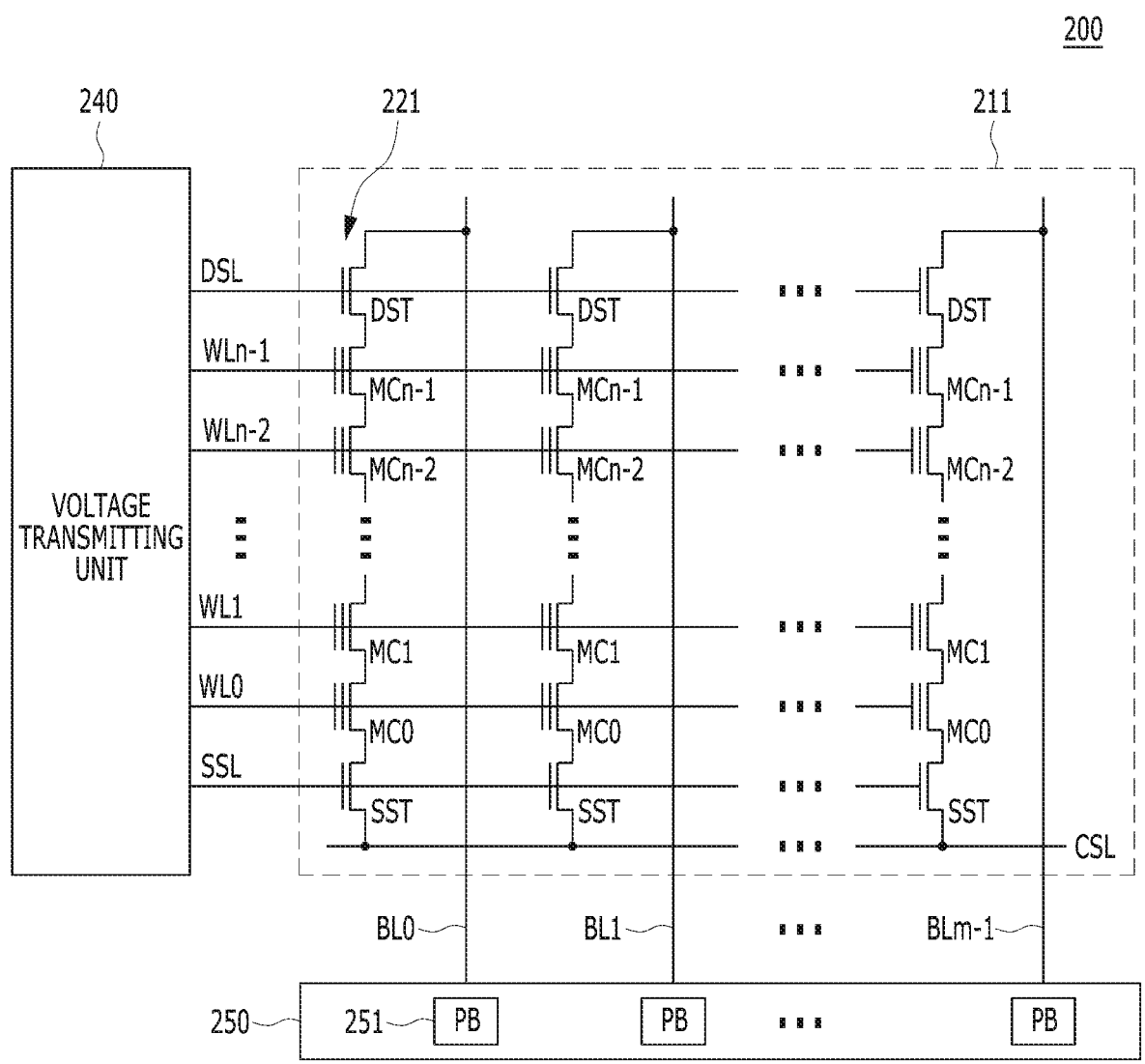
FIG. 4B is a circuit diagram illustrating a memory block shown in FIG. 4A.

FIG. 4B is a circuit diagram illustrating a memory block 211 shown in FIG. 4A.

Figure 5:
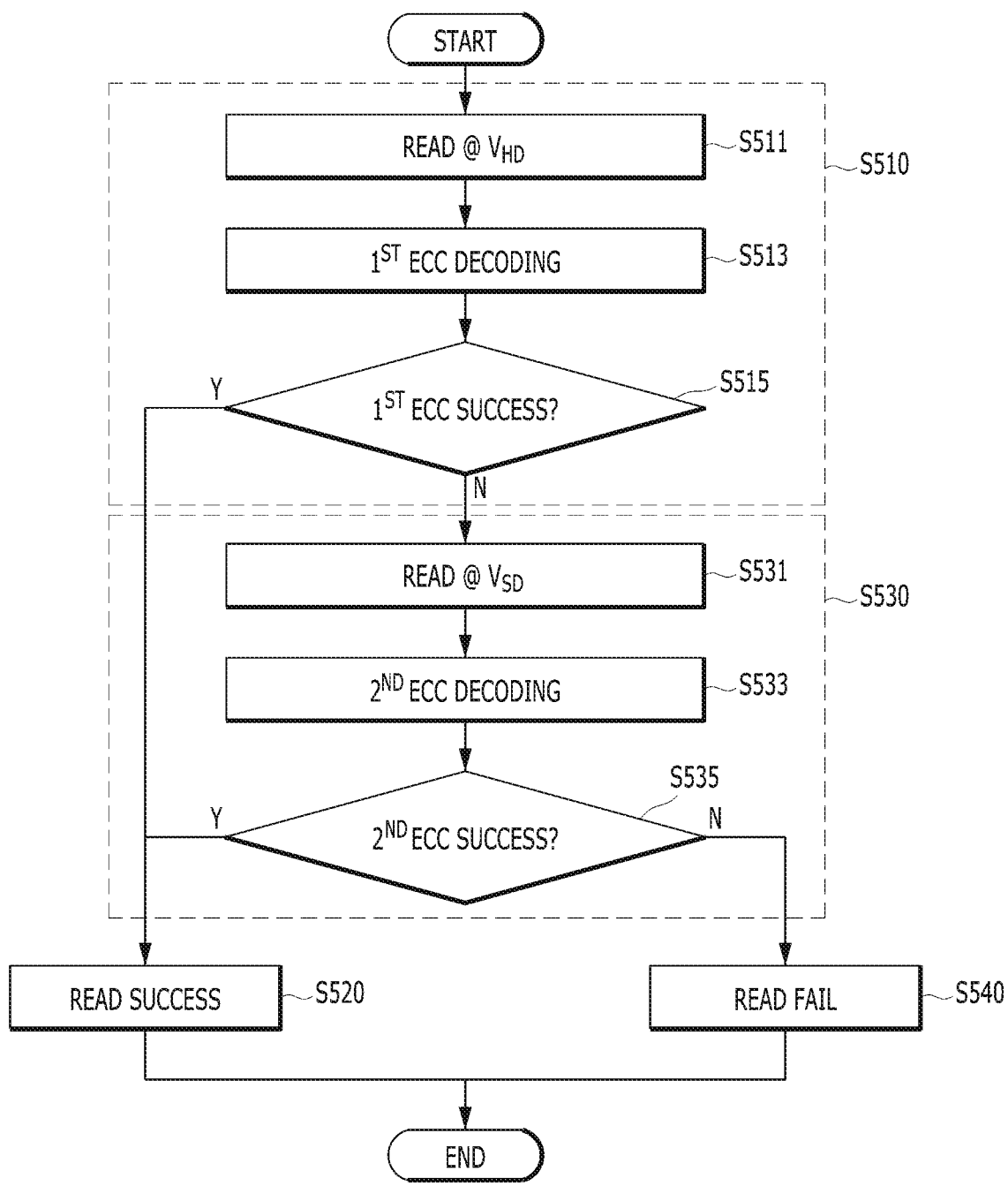
FIG. 5 is a flowchart illustrating an operation of a memory controller shown in FIG. 4A.

FIG. 5 is a flowchart illustrating an operation of a memory controller 100 shown in FIG. 4A.

Referring FIGS. 3 to 5, the semiconductor memory system 10 may include a semiconductor memory device 200 and the memory controller 100.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 may control overall operations of the semiconductor memory device 200. The memory controller 100 may include an ECC unit 130 for correcting error bits. The ECC unit 130 may include an ECC encoder 131 and an ECC decoder 133.

The ECC encoder 131 may perform error correction encoding on data to be programmed into the semiconductor memory device 200 to output data to which parity bits are added. The parity bits may be stored in the semiconductor memory device 200.

The ECC decoder 133 may perform error correction decoding on data read from the semiconductor memory device 200. The ECC decoder 133 may determine whether the error correction decoding is successful, and may output an instruction signal based on the determination result. The ECC decoder 133 may correct error bits of data using parity bits generated by the ECC encoding.

When the number of error bits exceeds error correction capacity of the ECC unit 130, the ECC unit 130 may not correct the error bits. In this case, the ECC unit 130 may generate an error correction fail signal.

The ECC unit 130 may correct an error through a coded modulation such as a low-density parity-check (LDPC) code, a Bose-Chaudhuri-Hocquenghem (BCH) code, a turbo code, a Reed-Solomon (RS) code, a convolution code, a Recursive Systematic Code (RSC), a Trellis-Coded Modulation (TCM), a Block Coded Modulation (BCM), and so on. The ECC unit 130 may include all circuits, systems, or devices for error correction.

In accordance with the embodiment of the present invention, the ECC unit 130 may perform an error bit correcting operation using hard read data and soft read data.

The controller 100 and the semiconductor memory device 200 may be integrated in a single semiconductor device. For example, the controller 100 and the semiconductor memory device 200 may be integrated in a single semiconductor device such as a solid-state drive (SSD). The solid state drive may include a storage device for storing data therein. When the semiconductor memory system 10 is used in an SSD, operation speed of a host (not shown) coupled to the semiconductor memory system 10 may remarkably improve.

The controller 100 and the semiconductor memory device 200 may be integrated in a single semiconductor device such as a memory card. For example, the controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the semiconductor memory system 10 may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or elements devices of a computing system.

Referring to FIG. 4A, the memory controller 100 may include a storage unit 110, a CPU 120, the ECC unit 130, a host interface 140, a memory interface 150, a system bus 160, a read bias control unit 170 and a quantization interval generation unit 180. The storage unit 110 may operate as a working memory of the CPU 120.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The ECC unit 130 may detect and correct an error included in the data read from the semiconductor memory device 200. The memory interface 150 may interface with the semiconductor memory device 200. The CPU 120 may perform various control operations.

The read bias control unit 170 may determine a soft read voltage $V_i$ of current index based on a predetermined hard read voltage $V_1$ and a quantization interval $\Delta_i$ of the current index.

The quantization interval generation unit 180 may determine the quantization interval $\Delta_i$ of the current index.

The semiconductor memory device 200 may include a memory cell array 210, a control circuit 220, a voltage supply unit 230, a voltage transmitting unit 240, a read/write circuit 250, and a column selection unit 260.

The memory cell array 210 may include a plurality of memory blocks 211. User data may be stored in the memory block 211.

Referring to FIG. 4B, the memory block 211 may include a plurality of cell strings 221 coupled to bit lines BL0 to BLm−1, respectively. The cell string 221 of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

FIG. 4B exemplarily illustrates a memory block 211 comprising a NAND-type flash memory cell. However, the memory block 211 of the semiconductor memory device 200 are not limited to NAND flash memory, but may comprise NOR-type flash memory, hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operations related to program, erase, and read operations of the semiconductor memory device 200.

The voltage supply unit 230 may provide word line voltages, for example, a program voltage, a read voltage, and a pass voltage, to the respective word lines according to an operation mode, and may provide a voltage to be supplied to a bulk, for example, a well region in which the memory cells are formed. A voltage generating operation of the voltage supply circuit 230 may be performed under control of the control circuit 220.

The voltage supply unit 230 may generate a multiple variable read voltages for generating read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply circuit 230 to the selected word line or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During the normal read operation, the column selection unit 260 may output the data read from the read/write circuit 250 to the outside, for example, the memory controller 100, based on column address information. On the other hand, during the verification read operation, the read data may be provided to a pass/fail verification circuit (not illustrated) included in the semiconductor memory device 200, and be used for determining whether a program operation of the memory cell succeeds.

During the program operation, the read/write circuit 250 may operate as a write driver for driving the bit lines according to data to be stored in the memory cell array 210. During the program operation, the read/write circuit 250 may receive the data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIGS. 4A to 5, an operation of the memory controller 100 is explained in detail. The operation of the memory controller 100 may include a hard decision ECC decoding step S510, and may additionally include a soft decision ECC decoding step S530. The object data of the hard decision ECC decoding step and the soft decision ECC decoding step (S510 and S530), which is data stored in the semiconductor memory device 200, is performed by the ECC unit 130, Encoded data, which is referred to as a codeword.

The hard decision ECC decoding step S510 may include a hard decision ECC decoding on data of predetermined length, which is read from a memory cell of the memory block 211 in response to hard read voltages $V_{HD}$. The hard decision ECC decoding step S510 may include steps S511 to S515.

The soft decision ECC decoding step S530 may include a soft decision ECC decoding on the data by generating soft read data according to soft read voltages $V_{SD}$ corresponding to a predetermined hard read voltage $V_{HD}$, when the hard decision ECC decoding of the hard decision ECC decoding step S510 finally fails. The soft decision ECC decoding step S530 may include steps S531 to S535.

At step S511, the data may be read from the semiconductor memory device 200 according to the hard read voltages $V_{HD}$. The memory controller 100 may provide a read command and an address to the semiconductor memory device 200. The semiconductor memory device 200 may perform a read operation on the data therefrom, corresponding to the hard read voltages $V_{HD}$, in response to the read command and the address. The read data may be provided to the memory controller 100.

At step S513, the hard decision ECC decoding as the first ECC decoding may be performed. The ECC unit 130 may perform the hard decision ECC decoding on the data (hereinafter "hard read data"), which is read from the semiconductor memory device 200 according to the hard read voltages $V_{HD}$ at step S511, based on an error correction code.

At step S515, it may be determined whether the hard decision ECC decoding succeeds or fails. That is, at step S515, it may be determined whether an error of the hard read data, on which the hard decision ECC decoding is performed at step S513, is corrected. For example, the memory controller 100 may determine whether an error of the hard read data, on which the hard decision ECC decoding is performed at step S513, is corrected based on the hard read data and a parity check matrix. When a product result of the parity check matrix and the hard read data, on which the hard decision ECC decoding is performed at step S513, is a zero vector ('0') it may be determined that the hard read data, on which the hard decision ECC decoding is performed, is corrected. On the other hand, when the product result of the parity check matrix and the hard read data, on which the hard decision ECC decoding is performed, is not the zero vector ('0'), it may be determined that the hard read data, on which the hard decision ECC decoding is performed, is not corrected.

When it is determined that the hard read data, on which the hard decision ECC decoding is performed, is corrected at step S515 (Y), it may be determined that the read operation in response to the hard read voltages $V_{HD}$ at step S511 is successful at step S520 and the operation of the memory controller 100 may end. The hard read data, on which the hard decision ECC decoding is performed at step S513, may be the error-corrected data and may be provided to outside (e.g. to a host or external device) or used in the memory controller 100.

When it is determined that the hard read data, on which the hard decision ECC decoding is performed, is not corrected at step S515 (N), the soft decision ECC decoding step S530 may be performed.

At step S531, the data may be read from the semiconductor memory device 200 according to the soft read voltages $V_{SD}$. For example, an additional read operation according to the soft read voltages $V_{SD}$ may be performed on the memory cell on which the hard decision ECC decoding step S510, according to the hard read voltages $V_{HD}$, is performed. The soft read voltages $V_{SD}$ may have different voltages than the hard read voltages $V_{HD}$.

At step S533, the soft decision ECC decoding as the second ECC decoding may be performed. The soft decision ECC decoding may be performed based on soft read data as well as the hard read data, on which the hard decision ECC decoding is performed at step S513, and the data read from the memory cell according to the soft read voltages $V_{SD}$ at step S531. The hard read voltages $V_{HD}$ and the soft read voltages $V_{SD}$ may have different voltages.

For example, each of the memory cells MC0 to MCn−1 of the semiconductor memory device 200 may belong to one of the threshold voltage distributions including first to seventh program states 'P1' to 'P7' and an erase state 'E'.

Each of the hard read voltages $V_{HD}$ may be between adjacent two states selected from the first to seventh program states 'P1' to 'P7' and the erase state 'E'. Each of the soft read voltages $V_{SD}$ may be between adjacent two states selected from the first to seventh program states 'P1' to 'P7' and the erase state 'E', which is different from the hard read voltages $V_{HD}$.

The hard read data read from the memory cells MC0 to MCn-1 in response to the hard read voltages $V_{HD}$ and the soft read data read therefrom according to the soft read voltages $V_{SD}$ may have different values from each other. For example, there may be a tailing memory cell in the memory cells MC0 to MCn-1 having a threshold voltage outside the threshold voltage distribution of a normal logic state. The hard read data read from the tailed memory cell according to the hard read voltages $V_{HD}$ and the soft read data read therefrom according to the soft read voltages $V_{SD}$ may have different values from each other. When the additional read operation according to the soft read voltages $V_{SD}$ is performed subsequently to the read operation according to the hard read voltages $V_{HD}$, additional information on the threshold voltages of the memory cells MC0 to MCn-1, that is, LLR (i.e., information on the tailed memory cell) that is information capable of giving reliability to the data read by the hard read, may be obtained.

When the additional information is obtained, the probability of whether the data of the memory cells MC0 to MCn-1 belong to a first state, e.g., '1', or a second state, e.g., '2', may increase. That is, the reliability of the ECC decoding may increase. The memory controller 100 may perform the soft decision ECC decoding based on the hard read data according to the hard read voltages $V_{HD}$ and the soft read data according to the soft read voltages $V_{SD}$. The relationship between the hard read voltages $V_{HD}$ and the soft read voltages $V_{SD}$ will be described with reference to FIGS. 6 and 7.

At step S535, it may be determined whether the soft decision ECC decoding succeeds or fails. That is, at step S535, it may be determined whether an error of the soft read data, on which the soft decision ECC decoding is performed at step S533, is corrected. For example, the memory controller 100 may determine whether an error of the soft read data, on which the soft decision ECC decoding is performed at step S533, is corrected based on the soft read data and the parity check matrix. When a product result of the parity check matrix and the soft read data, on which the soft decision ECC decoding is performed at step S533, is the zero vector ('0'), it may be determined that the soft read data, on which the soft decision ECC decoding is performed, is corrected. On the other hand, when the product result of the parity check matrix and the soft read data, on which the soft decision ECC decoding is performed, is not the zero vector ('0'), it may be determined that the soft read data, on which the soft decision ECC decoding is performed, is not corrected.

The product process of the parity check matrix and the hard read data during the hard decision ECC decoding step S510 may be substantially the same as the product process of the parity check matrix and the soft read data during the soft decision ECC decoding step S530.

When it is determined that the soft read data, on which the soft decision ECC decoding is performed, is corrected at step S535 (Y), it may be determined that the additional read operation according to soft read voltages $V_{SD}$ at step S531 is successful at step S520 and the operation of the memory controller 100 may end. The soft read data, on which the soft decision ECC decoding is performed at step S533, may be the error-corrected data and may be provided to the outside or used in the memory controller 100.

When it is determined that the soft read data, on which the soft decision ECC decoding is performed, is not corrected at step S535 (N), it may be determined that the read operation of the memory controller 100 on the memory cells MC0 to MCn-1 finally fails at step S540 and the operation of the memory controller 100 may end.

Figure 6:
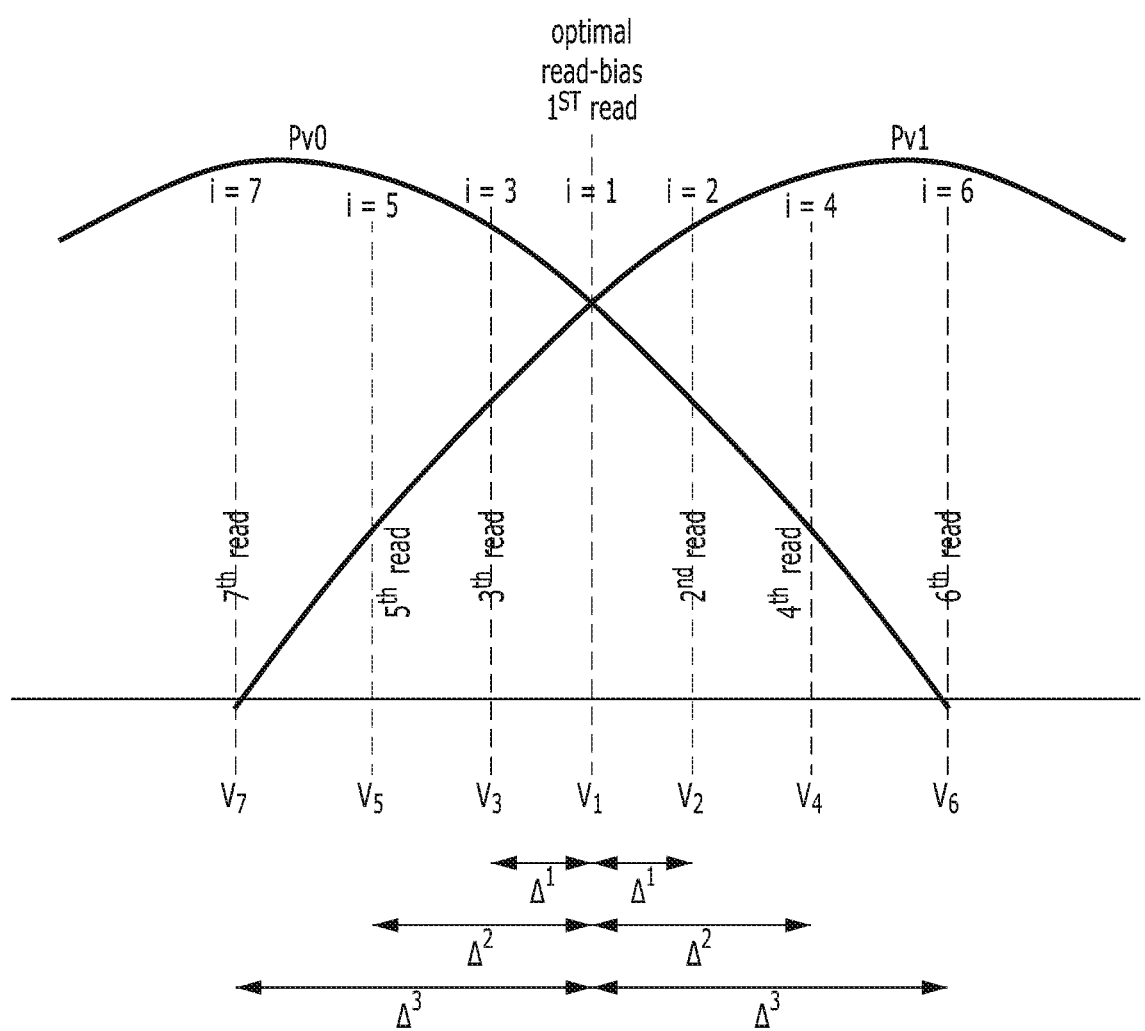
FIG. 6 is a schematic diagram illustrating a relationship between a hard read voltage and a soft read voltage.
Figure 7:
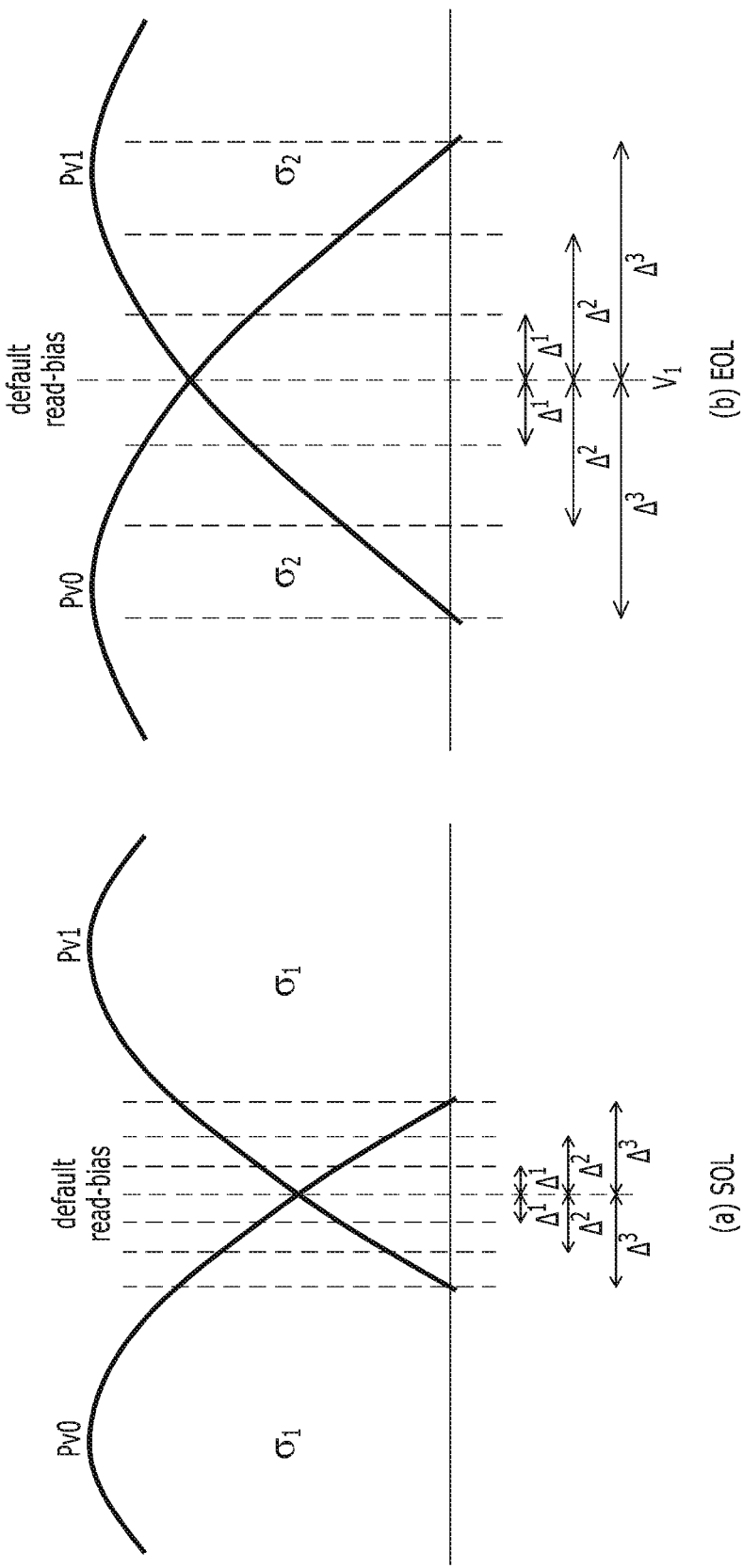
FIG. 7 is a schematic diagram illustrating changes in threshold voltages of a memory cell and changes in intervals between soft read voltages over time.

FIG. 6 is a schematic diagram illustrating a relationship between a hard read voltage and a soft read voltage, and FIG. 7 is a schematic diagram illustrating changes in threshold voltages of the memory cells MC0 to MCn-1 and changes in intervals between the soft read voltages $V_{SD}$ over time.

As described with reference to FIG. 5, the soft decision ECC decoding step S530 may be a step of a soft decision ECC decoding on data by generating soft read data according to soft read voltages $V_{SD}$ corresponding to a predetermined hard read voltage $V_{HD}$ when the hard decision ECC decoding of the hard decision ECC decoding step S510 finally fails.

The soft decision ECC decoding may be performed in response to a plurality of soft read voltages $V_{SD}$, each of which is spaced apart in voltage level from a predetermined hard read voltage $V_{HD}$ by a different quantization interval. For example, the low-density-parity-check (LDPC), which is one of the soft decision ECC decoding techniques applicable to NAND flash memory, works well by performing soft decision ECC decoding iteratively based on soft read data or a log likelihood ratio (LLR).

During the LDPC decoding, the LLR may be generated through the read operation on the memory cells MC0 to MCn-1 in response to the plurality of soft read voltages $V_{SD}$, each of which has a different quantization interval from the predetermined hard read voltage $V_{HD}$.

FIG. 6 shows a part (Pv0 and Pv1) of the threshold voltage distribution of one of the memory cells MC0 to MCn-1, and read voltages for reading data stored in the memory cells MC0 to MCn-1, and comprising a single hard read voltage $V_1$ and 6 soft read voltages $V_2$ to $V_7$, which respectively have the quantization intervals $\Delta^1$ to $\Delta^3$ from the predetermined hard read voltage $V_1$. Levels of the 6 soft read voltages $V_2$ to $V_7$ may be determined by magnitudes of the quantization intervals $\Delta^1$ to $\Delta^3$, respectively.

For the success of the soft decision ECC decoding step S530, the quantization intervals $\Delta^1$ to $\Delta^3$ should be optimized. The optimization of the quantization intervals $\Delta^1$ to $\Delta^3$ may depend on the deterioration degree of the memory cells MC0 to MCn-1. That is, the optimization of the quantization intervals $\Delta^1$ to $\Delta^3$ may depend on the threshold voltage distribution of the memory cells MC0 to MCn-1, i.e., the variance of the threshold voltage distribution Pv0 and Pv1 shown in FIG. 6. The optimization of the quantization intervals has been published in the paper [J. Wang, T. Courtade, H. Shankar, and R. Wesel, "Soft Information for LDPC decoding in flash: Mutual-information optimized quantization," in Proc. IEEE Global Commum. Conf. (GLOBECOM), 2011, pp. 5-9.]

FIG. 7 shows that the optimization of the quantization intervals $\Delta^1$ to $\Delta^3$ depend on the threshold voltage distribution of the memory cells MC0 to MCn-1, i.e., the variance of the threshold voltage distribution Pv0 and Pv1 shown in FIG. 7A.

For example, the variance $\sigma_1$ of the threshold voltage distribution Pv0 and Pv1 at the "Start of Life (SOL)" of the NAND flash memory device is generally smaller than the variance $\sigma_2$ of the threshold voltage distribution Pv0 and Pv1 at the "End of Life (EOL)" of the NAND flash memory device. Therefore, the optimized quantization intervals $\Delta^1$ to $\Delta^3$ at the EOL should be greater than the optimized quantization intervals $\Delta^1$ to $\Delta^3$ at the SOL.

Therefore, for the success of the soft decision ECC decoding step S530, the quantization intervals $\Delta^1$ to $\Delta^3$ should be optimized and the optimization of the quantization intervals $\Delta^1$ to $\Delta^3$ may be determined based on the variance of the threshold voltage distribution of the memory cells MC0 to MCn−1.

According to the prior art, the soft decision ECC decoding step S530 is performed in response to the soft read voltages $V_{SD}$ having quantization intervals $\Delta^1$ to $\Delta^3$ which are fixed, since it is difficult to identify in real time the variance of the threshold voltage distribution of the memory cells MC0 to MCn−1. For example, according to the prior art, the soft decision ECC decoding step S530 is performed according to a first group of quantization intervals $\Delta^1$ having a first amount (4 steps=80 mV), a second group of quantization intervals $\Delta^2$ having a second amount (8 steps=160 mV), and a third group of quantization intervals $\Delta^3$ having a third amount (16 steps=32 mV). In the soft decision ECC decoding according to such fixed quantization intervals, it is difficult to reflect the time-varying variance of the threshold voltage distribution of the memory cells MC0 to MCn−1 which deteriorate as time goes on.

Therefore, for the success of the soft decision ECC decoding step S530, what is required are the optimized quantization intervals $\Delta_1$ to $\Delta_3$ adequately reflecting the time-varying variance of the threshold voltage distribution of the memory cells MC0 to MCn−1, which are deteriorated as time goes on.

In accordance with an exemplary embodiment of the present invention, optimized quantization intervals may be realized by adjusting the quantization intervals based on the USC since the deterioration degree of the memory cells MC0 to MCn−1 may be represented by the USC obtained during the hard decision ECC decoding step S510.

Figure 8A:
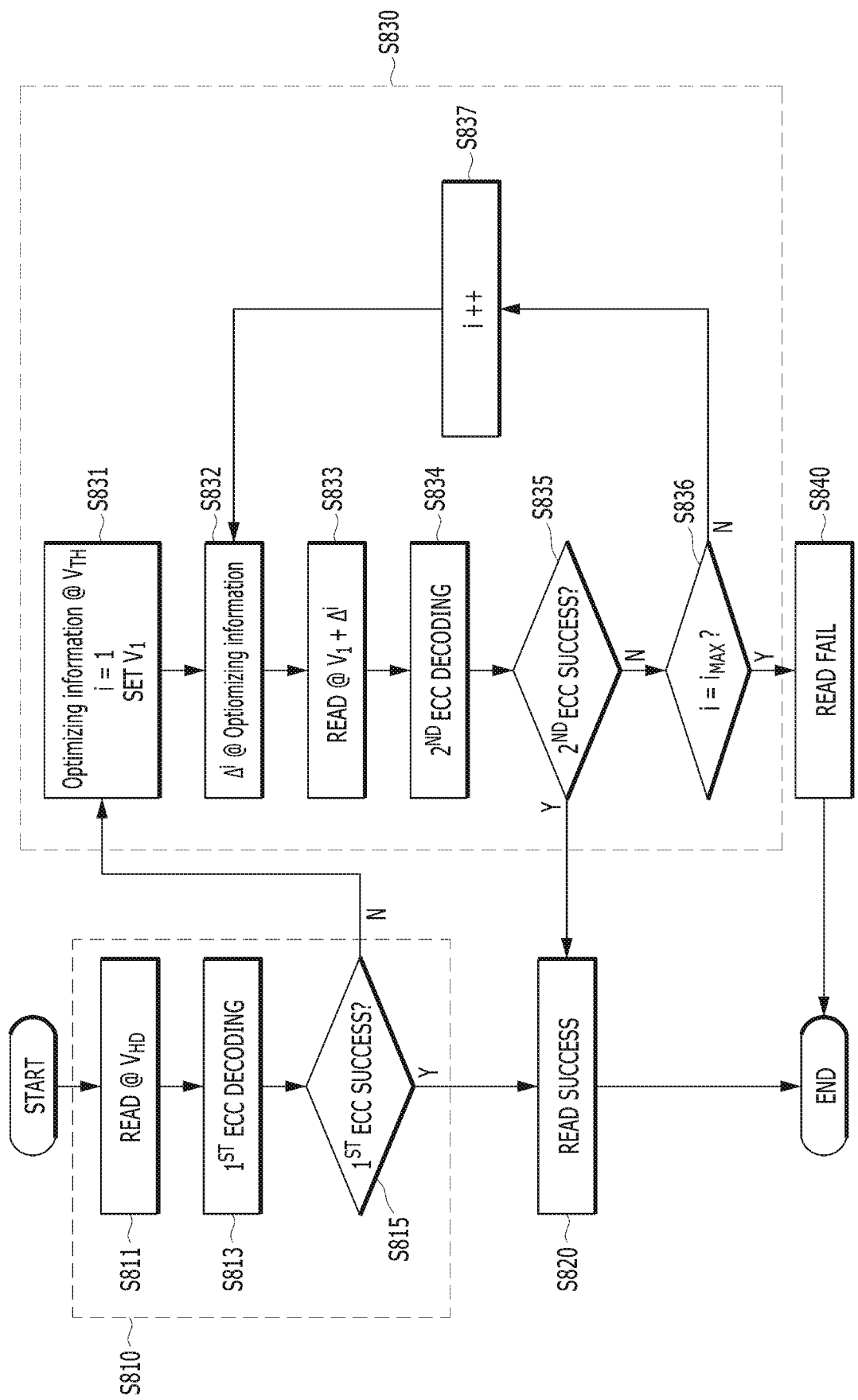
FIG. 8A is a flowchart illustrating an operation of a memory controller in accordance with an embodiment of the present invention.

FIG. 8A is a flowchart illustrating an operation of the memory controller 100 in accordance with an embodiment of the present invention.

FIG. 8A shows in detail the operation of the semiconductor memory system 10 described with reference to FIG. 5.

Referring to FIGS. 4A and 8A, the operation of the semiconductor memory system 10 may include a first ECC decoding step S810, and may additionally include a second ECC decoding step S830.

For example, the first ECC decoding step S810 may be a step of a hard decision ECC decoding operation to codeword of predetermined length, which is read from a memory cell of the memory block 211 according to the hard read voltage $V_{HD}$. The first ECC decoding step S810 may include steps S811 to S815.

For example, the second ECC decoding step S830 may be a step of a soft decision ECC decoding operation of performing ECC operation to soft decision data, which is formed regarding a predetermined hard read voltage $V_1$, when the hard decision ECC decoding operation of the first ECC decoding step S810 finally fails. The second ECC decoding step S830 may include steps S831 to S835.

At step S811, data or codeword may be read from the semiconductor memory device 200 according to the hard read voltages $V_{HD}$. The memory controller 100 may provide a read command and an address to the semiconductor memory device 200. The semiconductor memory device 200 may read data or codeword therefrom according to the hard read voltages $V_{HD}$ in response to the read command and the address. The hard read data may be provided to the memory controller 100.

At step S813, the hard decision ECC decoding operation as the first ECC decoding operation may be performed. The ECC unit 130 may perform the hard decision ECC decoding operation to the hard read data, which is read from the semiconductor memory device 200 according to the hard read voltages $V_{HD}$, by using an error correction code.

At step S815, it may be determined whether the hard decision ECC decoding operation succeeds or fails. That is, at step S815, it may be determined whether or not an error of the hard read data, to which the hard decision ECC decoding operation is performed at step S813, is corrected. For example, the memory controller 100 may determine whether or not an error of the hard read data, to which the hard decision ECC decoding operation is performed at step S813, is corrected by using the hard read data and a parity check matrix. For example, when product result of the parity check matrix and the hard read data, to which the hard decision ECC decoding operation is performed at step S813, is a zero vector ('0'), it may be determined that the hard read data, to which the hard decision ECC decoding operation is performed, is corrected. On the other hand, when product result of the parity check matrix and the hard read data is not the zero vector ('0'), it may be determined that the hard read data is not corrected.

When it is determined that the hard read data, to which the hard decision ECC decoding operation is performed at step S813, is corrected as the result of determination of step S815, it may be determined at step S820 that the read operation according to hard read voltage $V_{HD}$ at step S811 is successful and the operation of the memory controller 100 may end.

When it is determined that the hard read data, to which the hard decision ECC decoding operation is performed at step S813, is not corrected as the result of determination of step S515, the second ECC decoding step S530 may be performed.

As described above, for a successful operation of the second ECC decoding step S530, required are optimized values of quantized intervals (e.g., $\Delta^1$ to $\Delta^3$), which appropriately represent the variation values varying due to deterioration of the memory cells as time flies.

In accordance with an embodiment of the present invention, the quantized intervals ($\Delta^1$ to $\Delta^3$) may be optimized by adjusting the quantized intervals ($\Delta^1$ to $\Delta^3$) according to optimization information obtained at the first ECC decoding step S810.

The optimization information may include deterioration information obtainable from the memory blocks 211, decoder parameter information obtainable from the ECC decoder 133, and constituent code parameter information. For example, the deterioration information may include information of P/E cycle and data retention time of the memory blocks 211. For example, the decoder parameter information may include a chase decoding parameter (nf) and the constituent code parameter information may include information of length (n) and error correction capability (t) of constituent BCH code when the ECC decoder 133 uses the BCH scheme as a ECC scheme. In accordance with an embodiment of the present invention, the quantized intervals may be optimized on the basis of the optimization information. Optimized values of the quantized intervals may be obtained through an arithmetic operation based on the optimization information or obtained by selecting quantized intervals, which correspond to the optimization information in a predetermined table of quantized intervals. The optimization information table may be mapped to various optimization information.

At step S831, various values may be set for the second ECC decoding step S830. The predetermined hard read voltage $V_1$ may be determined for the soft read voltages $V_2$ to $V_5$. Obtained may be the optimization information corresponding to the hard read voltage $V_{HD}$ of the first ECC decoding step S810, which is evaluated as failed. Index (i) may be initialized in order to indicate a quantization interval pair ($\Delta^i$). For example, in case of 2 quantization interval pairs ($\Delta^i$), the index (i) may be one (1) or two (2) and the initial value of the index (i) may be one (1). In this case, the 2 quantization interval pairs ($\Delta^i$) may be a first quantization interval pair ($\Delta^1$) and a second quantization interval pair ($\Delta^2$). The predetermined hard read voltage $V_1$ may be the hard read voltage $V_{HD}$ used at the first ECC decoding step S810. In this disclosure, it is exemplified that a number of quantization interval pairs ($\Delta^1$ and $\Delta^2$) is two (2) and a number of soft read voltages $V_2$ to $V_5$ is four (4), which may vary according to system design.

At step S832, an optimized quantization interval pair ($\Delta^i$) of a current index (i) corresponding to the optimization information may be obtained. As described above, the optimized quantization interval pair ($\Delta^i$) of a current index (i) may be obtained through an arithmetic operation based on the optimization information or obtained by selecting quantized intervals, which correspond to the optimization information in a predetermined table of quantized intervals. For example, the optimized quantization interval pair ($\Delta^i$) may be obtained through following equation 1. Or, the optimized quantization interval pair ($\Delta^i$) may be obtained by generating a table of quantization interval pairs ($\Delta^i$) and selecting one from the table of quantization interval pairs ($\Delta^i$) based on optimization information corresponding to the hard read voltage $V_{HD}$ of the first ECC decoding step S810 evaluated as failed. The table of quantization interval pairs ($\Delta^i$) may have various possible optimization information as index thereof and corresponding optimized quantization interval pairs ($\Delta^i$) obtained through following equation 1.

$$\text{first quantization interval pair } (\Delta^1) = \underset{\Delta^1}{\operatorname{argmax}} \Sigma_{r \in R} p(c \in C_c, r; \Delta^1) \cdot 1_{\Delta'(c,L(r)) \leq T_{ML}(r)}$$

$$\text{second quantization interval pair } (\Delta^2) = \underset{\Delta^2}{\operatorname{argmax}} \Sigma_{r \in R} p(c \in C_c, r; \Delta^1, \Delta^2) \cdot 1_{\Delta'(c,L(r)) \leq T_{ML}(r)}$$

[Equation 1]

In equation 1, "r" may represent a channel output of a constituent code. For example, the constituent code may be a codeword read according to the hard read voltage $V_{HD}$ at step S811. For example, when the constituent code is the BCH code, the channel output (r) of the constituent code may be a read codeword, which is read from the cell array 210 according to the hard read voltage $V_{HD}$. The channel output (r) of the constituent code may be decoded as an output data through the second ECC decoding step S830 of the ECC decoder 133 described with reference to FIG. 5.

The ECC decoder 133 may map each bit of the channel output (r) of the constituent code, which is provided through a channel, into a predetermined first value. The ECC decoder 133 may generate candidate codeword by using the mapped first value as reliability.

In equation 1, may represent a LLR vector corresponding to the channel output (r) of the constituent code, whose length is "n".

The ECC decoder 133 may map each bit ($r_i$) comprised in the channel output (r) of the constituent code to a corresponding LLR value or a first value ($l_i$) representing constant multiple of the corresponding LLR value (hereinafter, collectively referred to as a LLR value). The ECC decoder 133 may perform an ECC decoding operation with the corresponding LLR value or the constant multiple of the corresponding LLR value. The LLR value ($l_i$) may be predetermined.

In equation 1, "c" may represent a corrected codeword, whose error is corrected through an error correction operation.

In equation 1, "$C_c$" may represent a group of candidate codewords. The candidate codewords may be codewords corresponding to provided data, which is error-corrected on the basis of the provided data.

In equation 1, "$\Delta'(c, L(r))$" may represent a distance between the error-corrected codeword (c) and the LLR vector (L).

The ECC decoder 133 may generate the candidate codewords corresponding to the channel output (r) of the constituent code. For the generation of the candidate codewords, the ECC decoder 133 may generate a reliability array ($R_{abs}$) and a code array (Y) for the channel output (r) of the constituent code by using a magnitude of the mapped LLR value ($l_i$) as a reliability value. The reliability array ($R_{abs}$) may be a bit array, in which magnitudes of the first values ($l_i$) are arranged. The code array (Y) may correspond to the reliability array ($R_{abs}$), and may be a bit array, in which signs of the LLR value ($l_i$) are arranged. When a bit value of the reliability array ($R_{abs}$) is greater than zero (0), a corresponding bit value of the code array (Y) may be one (1). Otherwise, a corresponding bit value of the code array (Y) may be zero (0). The ECC decoder 133 may locate "p" numbers of bits (i.e., least reliabilities) having least reliability values (i.e., least values among the mapped LLR values ($l_i$) in the reliability array ($R_{abs}$). The number of "p" may vary according to a system design. The ECC decoder 133 may generate groups ($T^q$) of test patterns having "q" numbers of test patterns by generating all of available binary combinations at the locations of the "p" numbers of the least reliabilities in the reliability array ($R_{abs}$). During the generation of the binary combinations, a value of zero (0) may be assigned to all of remaining locations other than the locations of the "p" numbers of the least reliabilities. Accordingly, "q" may be "$2^p$". The ECC decoder 133 may generate groups ($Z^q$) of test arrays comprising "q" numbers of test arrays through a modulo 2 (i.e., XOR) operation to sum of the code array (Y) and the respective test patterns of the groups ($T^q$) of test patterns. The ECC decoder 133 may generate a syndrome array (S) through the inner product of the test matrix (H) of the constituent code and the respective test arrays ($Z^i$) of the groups ($Z^q$) of test arrays. When the syndrome array (S) does not have a value of zero (0), a corresponding test arrays ($Z^i$) may have a possibility of having an error. In this case, the corresponding test arrays ($Z^i$) may be regarded as having a bit-error. Among the test arrays ($Z^i$) of the groups ($Z^q$) of test arrays, test arrays ($Z^i$) regarded as having a bit-error may be the candidate codewords when the bit-error is corrected.

The ECC decoder 133 may detect as the error-corrected codeword (c) one having least distance from the channel output (r) of the constituent code among the candidate codewords. Each distance between the channel output (r) of the constituent code and the respective candidate codewords may be obtained through sum of the reliability values (i.e., the mapped LLR values ($l_i$)) respectively corresponding to error-corrected bits of the candidate codewords. The ECC decoder 133 may detect the error-corrected codeword (c) having least distance from the channel output (r) of the constituent code through following equation 2.

$$\Delta'(c, r) = \sum_{i \in S_c} |l_i| \qquad \text{[Equation 2]}$$

In equation 2, "$S_c$" may represent a group of indexes corresponding to the error-corrected bits of the candidate codewords.

In equation 1, "$T_{ML}$" may represent a threshold for determining reliability of the error-corrected codeword (c). In equation 1, "$\Delta'(c, L(r)) \leq T_{ML}(r)$" may represent distance ($\Delta'(c, L(r))$) of the error-corrected codeword (c) from the LLR vector (L) is less than the threshold ($T_{ML}(r)$). In this case, the error-corrected codeword (c) may be evaluated as reliable. However, when distance ($\Delta'(c, L(r))$) of the error-corrected codeword (c) from the LLR vector (L) is greater than the threshold ($T_{ML}(r)$), the error-corrected codeword (c) may be evaluated as unreliable.

In equation 1, the quantization interval pairs (i.e., the first quantization interval pair ($\Delta^1$) and the second quantization interval pair ($\Delta^2$)) may be determined such that the absolute LLR values of the channel output (r) of the constituent code, which is divided by the hard read voltage $V_1$ and the soft read voltages $V_2$ to $V_5$, are the same as one another. Therefore, when a quantization interval of the quantization interval pair ($\Delta^i$) (e.g., a quantization interval related to lower voltage than the hard read voltage $V_1$) is determined, the other quantization interval of the quantization interval pair ($\Delta^i$) (e.g., a quantization interval related to higher voltage than the hard read voltage $V_1$) may be determined automatically.

$$\begin{aligned} p(c \in C_c, r; \delta) &= p(n_e - n_{fe} \leq t, r) \\ &= \sum_{n_{fe}: \, n_e - n_{fe} \leq t} p(n_{fe}, n_u, n_e, n_{ue}) \\ &= \sum_{n_{fe}: \, n_e - n_{fe} \leq t} p(n_{fe} | n_u, n_e, n_{ue}) p(n_e, n_{ue} | n_u) p(n_u) \end{aligned} \qquad \text{[Equation 3]}$$

Equation 3 may represent "$p(c \in C_c, r; \delta)$" of equation 1.

In equation 3, "$n_u$" may represent a number of unreliable bits. The unreliable bits may be a predetermined number of bits having least ones among the LLR values, which respectively correspond to bits comprised in the channel output (r) of the constituent code.

"$n_e$" may represent a number of elements in a set ($S_c$) of index values respectively corresponding to the error-corrected bits of the error-corrected codeword (c). "$n_{ue}$" may represent a number of the error-bits among the unreliable bits. "$n_{fe}$" may represent a number of the error-bits among bit-flipped bits through the chase algorithm. "t" may represent an error-correction capability of the ECC decoder 133. Information of the error-correction capability may be included in the constituent code parameter information.

As describe above, in accordance with an embodiment of the present invention, the quantization interval pair ($\Delta^i$) may be optimized by adjusting the quantization interval pair ($\Delta^i$) according to optimization information obtained at the first ECC decoding step S810. The optimization information may include deterioration information obtainable from the memory blocks 211, decoder parameter information obtainable from the ECC decoder 133, and constituent code parameter information. For example, the deterioration information may include information of P/E cycle and data retention time of the memory blocks 211. For example, the decoder parameter information may include a chase decoding parameter (nf) and the constituent code parameter information may include information of length (n) and error correction capability (t) of constituent BCH code when the ECC decoder 133 uses the BCH scheme as a ECC scheme. The optimization information may be obtained at step S831, and the quantization interval pair ($\Delta^i$) may be obtained at step S832 according to the optimization information obtained at step S831. Therefore, the error correction capability (t) may be used in equation 3 for obtaining the optimization information and the quantization interval pair ($\Delta^i$).

$$p(n_{fe} | n_u, n_e, n_{ue}) = \frac{\binom{n_{ue}}{n_{fe}} \cdot \binom{n_u - n_{ue}}{\min(n_f, n_u) - n_{fe}}}{\binom{n_u}{\min(n_f, n_u)}} \qquad \text{[Equation 4]}$$

Equation 4 may represent "$p(n_{fs} | n_u, n_s, n_{ue})$" of equation 3.

A chase decoding parameter "$f$" may be included in the decoder parameter information as the optimization information, and may represent a number of flipped bits.

The optimization information may be obtained at step S831, and the quantization interval pair (At) may be obtained at step S832 according to the optimization information obtained at step S831. The optimization information may include the decoding parameter information. Therefore, the chase decoding parameter "$n_f$" representing the decoding parameter information may be used in equation 4 as the decoding parameter information for obtaining the optimization information and the quantization interval pair ($\Delta^i$).

$$p(n_u) = \mathcal{B}(n, n_u, p_u) \qquad \text{[Equation 5]}$$

$$\mathcal{B}(n, k, p) = \binom{n}{k} p^k (1-p)^{n-k} \qquad \text{[Equation 6]}$$

Equation 5 may represent "$p(n_u)$" of equation 3.

In equation 5, "$P_u$" may represent a possibility that each bit of the channel output (r) of the constituent code is unreliable.

In equation 5, "$B(n, n_u, p_u)$" may be obtained by equation 6.

The optimization information may be obtained at step S831, and the quantization interval pair ($\Delta^i$) may be obtained at step S832 according to the optimization information obtained at step S831. The optimization information may include the deterioration information obtainable from the memory blocks 211. Therefore, the possibility "$P_u$" representing that each bit of the channel output (r) of the constituent code is unreliable may be used in equation 5 as the deterioration information for obtaining the optimization information and the quantization interval pair ($\Delta^i$).

$$\begin{aligned} p(n_e, n_{ue} | n_u) &= p(n_{re}, n_{ue} | n_r, n_u) \\ &= p(n_{re} | n_r, n_u) p(n_{ue} | n_r, n_u) \\ &= p(n_{re} | n_r) p(n_{ue} | n_u) \\ &= B(n_r, n_{re}, p_{re}) B(n_u, n_{ue}, p_{ue}) \end{aligned} \qquad \text{[Equation 7]}$$

Equation 7 may represent "$p(n_e, n_{ue}|n_u)$" of equation 3.

In equation 7, "$P_{re}$" may represent a possibility that reliable bits are erroneous. The reliable bits may be remaining bits other than the unreliable bits among the bits comprised in the channel output (r) of the constituent code. "$P_{ue}$" may represent a possibility that the unreliable bits are erroneous. "$n_r$" may represent a number of the reliable bits. "$n_{re}$" may represent a number of the bits having errors among the reliable bits. In equation 7, "$B(n_r, n_{re}, p_{re})B(n_u, n_{ue}, p_{ue})$" may be obtained through equation 6.

The optimization information may be obtained at step S831, and the quantization interval pair ($\Delta^i$) may be obtained at step S832 according to the optimization information obtained at step S831. The optimization information may include the deterioration information obtainable from the memory blocks 211. Therefore, the possibility "$P_{re}$" representing that reliable bits are erroneous and the possibility "$P_{ue}$" representing that the unreliable bits are erroneous may be used in equation 7 as the deterioration information for obtaining the optimization information and the quantization interval pair ($\Delta^i$).

$$T_{ML}(r) = \mathbb{E}\left[\sum_{i=1}^{[d^*-n_e-r]+}|l_i^o|\right] + \mathbb{E}[V] \cdot \mathbb{E}[|l_i|] \quad \text{[Equation 8]}$$

Equation 8 may represent "$T_{ML}(r)$" of equation 1.

In equation 8, "$\mathbb{E}$" may represent expectation.

In equation 8, probability distribution of random variable (V) and least distance ($d^*$) of the constituent code (e.g., the BCH code) may be defined by following equations 9 and 10. Condition of the absolute values ($|l_i^o|$) of LLR may be defined by following equation 11.

$$p(V=i) = \binom{n}{i} / \sum_j \binom{n}{j} \quad \text{[Equation 9]}$$

Equation 9 may represent probability distribution of random variable (V) of equation 8.

The optimization information may be obtained at step S831, and the quantization interval pair may be obtained at step S832 according to the optimization information obtained at step S831. The optimization information may include the constituent code parameter information. Therefore, the information of length (n) and error correction capability (t) of the constituent code may be used in equation 7 as the constituent code parameter information for obtaining the optimization information and the quantization interval pair ($\Delta^i$).

$$d^* = 2t+1 \quad \text{[Equation 10]}$$

Equation 10 may represent least distance ($d^*$) of the constituent code of equation 8.

The optimization information may be obtained at step S831, and the quantization interval pair ($\Delta^i$) may be obtained at step S832 according to the optimization information obtained at step S831. The optimization information may include the constituent code parameter information. Therefore, the information of error correction capability (t) of the constituent code may be used in equation 10 as the constituent code parameter information for obtaining the optimization information and the quantization interval pair ($\Delta^i$).

$$|l_1^o| \leq |l_2^o| \leq |l_3^o| \leq \ldots \leq |l_n^o| \quad \text{[Equation 11]}$$

Equation 11 may represent condition of the absolute values ($|l_i^o|$) of LLR of equation 8. Only the absolute values ($|l_i^o|$) of LLR satisfying the condition of equation 11 may define equation 8.

At step S833, data or codeword may be read from the memory device 200 according to a soft read voltage ($V_i$) of a current index, which is determined by the hard read voltage $V_1$, which is determined at step S831, and the quantization interval pair ($\Delta^i$) of the current index, which is obtained at step S832.

The read bias control unit 170 described with reference to FIG. 4A may determine the soft read voltage ($V_i$) of the current index based on the hard read voltage $V_1$ and the quantization interval pair ($\Delta^i$) of the current index at step S833.

At step S834, the soft decision ECC decoding operation as the second ECC decoding operation may be performed. The ECC unit 130 may perform a soft decision ECC decoding operation to soft read data, which is read from the memory device 200 according to the soft read voltage ($V_i$) of the current index, by using an error correction code.

At step S835, it may be determined whether the soft decision ECC decoding operation succeeds or fails. That is, at step S835, it may be determined whether or not an error of the soft read data, to which the soft decision ECC decoding operation is performed at step S834, is corrected.

When it is determined that the soft read data, to which the soft decision ECC decoding operation is performed at step S834, is corrected as the result of determination of step S835, it may be determined at step S820 that the read operation according to soft read voltage ($V_i$) of the current index at step S834 is successful and the operation of the memory controller 100 may end.

When it is determined that the soft read data, to which the soft decision ECC decoding operation is performed at step S834, is not corrected as the result of determination of step S835, steps S832 to S836 may be repeated by increasing the index (i) at step S837 until the index (i) reaches its maximum value (iMAX: e.g., '2').

When the first quantization interval pair ($\Delta^1$) is determined, the soft read voltages $V_2$ and $V_3$ may be determined. As the index (i) increases, the second quantization interval pair ($\Delta^2$) through $$\text{"}\operatorname*{argmax}_{\Delta^2} \Sigma_{r \in R} p(c \in C_c, r; \Delta^1, \Delta^2) \cdot 1_{\Delta'(c,L(r)) \leq T_{ML}(r)}\text{"}$$

of equation 1. When the second quantization interval pair ($\Delta^2$) is determined, the soft read voltages $V_4$ and $V_5$ may be determined.

Figure 8B:
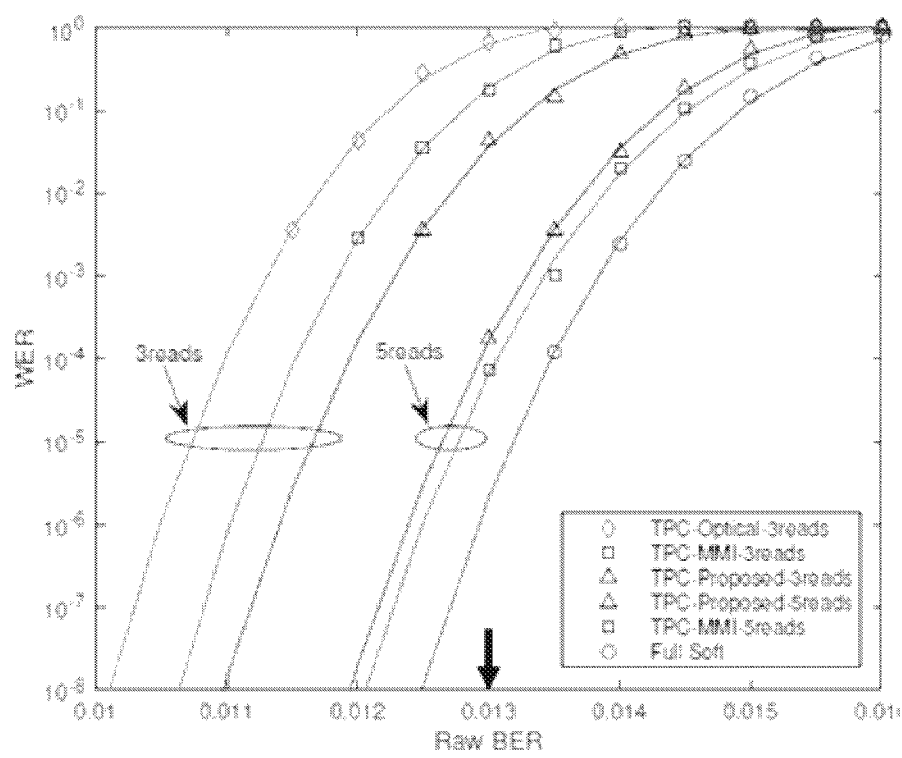
FIG. 8B is a graph illustrating a simulation result of an operation of a memory system in accordance with an embodiment of the present invention.

FIG. 8B is a simulation result of the operation of the memory controller 100 described with reference to FIG. 8A.

Referring to FIG. 8B, the simulation result shows improved performance according to the channel quantization scheme despite the same code. Specifically, x axis may be the Raw BER representing a level of errors of data read from the memory device. y axis may be the WER representing misrecognition to a word. At a particular value of x axis, greater value of y axis may represent better improved performance. Referring FIG. 8B, denotation "Full Soft" may represent channel output of non-quantized channel. Given that the length of the constituent BCH code is 255 (i.e., n=255), a length of information bits is 239 (i.e., k=239), an error correction capability is 2 (i.e., t=2) and the chase decoding parameter is 3 (i.e., $n_j$=3), each of a case of the soft read voltages $V_2$ and $V_3$ (denoted as "3reads" in FIG. 8B) and a case of the soft read voltages $V_4$ and $V_5$ (denoted as "5reads" in FIG. 8B) shows better improved performance than the case of "Full Soft".

The semiconductor memory device may receive a first read command, may perform first and second hard decision read operation according to first and second hard read voltages, which are different from each other, may form hard decision data, may select a particular hard read voltage among a plurality hard read voltages based on status of error bits of the hard decision data, may form soft decision data by using soft read voltages different by a predetermined amount from a hard read voltage corresponding to selected data, and may provide the soft decision data to the memory controller 100.

Figure 9:
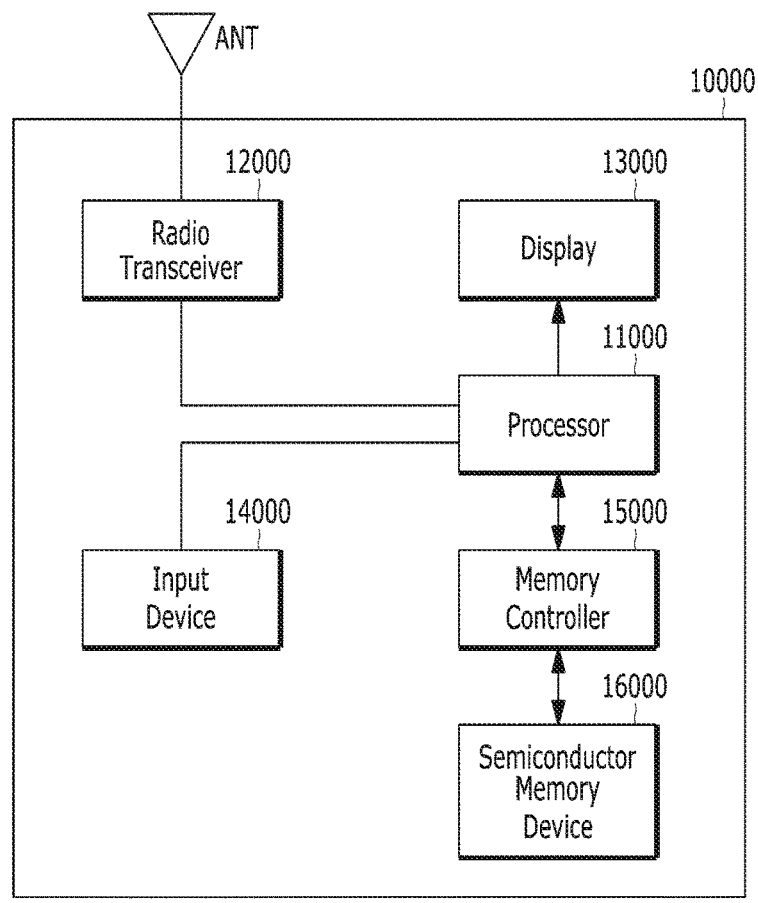
FIG. 9 is a block diagram schematically illustrating an electronic device including a semiconductor memory system in accordance with an embodiment of the present invention.

FIG. 9 is a block diagram schematically illustrating an electronic device 10000 including a memory controller 15000 and a semiconductor memory device 16000 in accordance with an embodiment of the present invention.

Referring to FIG. 9, the electronic device 10000 such as a cellular phone, a smart phone, or a tablet PC may include the semiconductor memory device 16000 implemented by a flash memory device and the memory controller 15000 to control the semiconductor memory device 16000.

The semiconductor memory device 16000 may correspond to the semiconductor memory device 200 described above with reference to FIGS. 3 to 4b. The semiconductor memory device 16000 may store random data.

The memory controller 15000 may correspond to the memory controller described with reference to FIGS. 3 to 8b. The memory controller 15000 may be controlled by a processor 11000 which controls overall operations of the electronic device 10000.

Data stored in the semiconductor memory device 16000 may be displayed through a display 13000 under the control of the memory controller 15000. The memory controller 15000 operates under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000, and may be implemented by a pointing device such as a touch pad or a computer mouse, a key pad, or a keyboard.

The processor 11000 may control the display 13000 such that the data from the semiconductor memory device 16000, the radio signal from the radio transceiver 12000 or the data from the input device 14000 is displayed through the display 13000.

Figure 10:
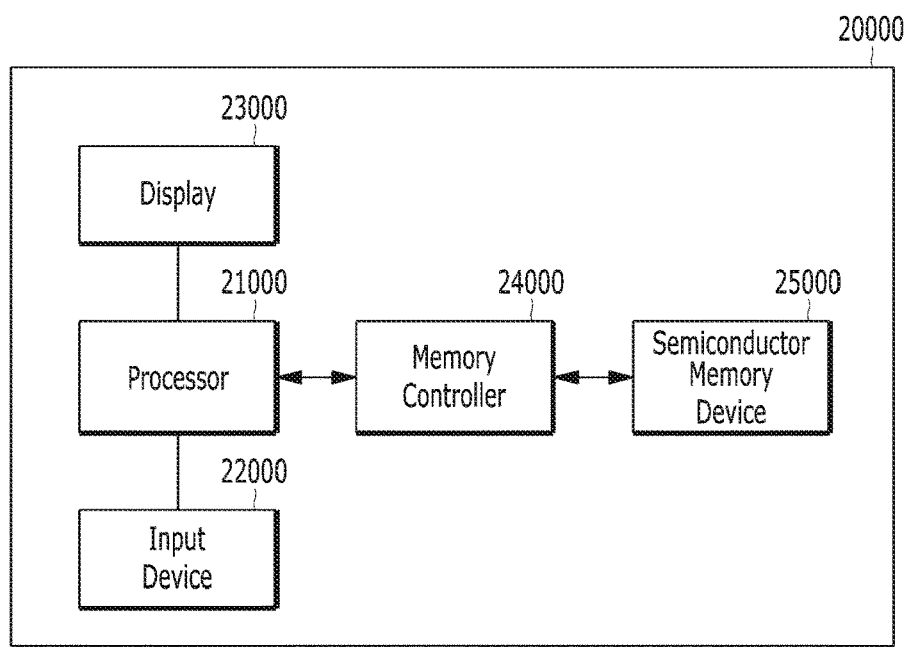
FIG. 10 is a block diagram schematically illustrating an electronic device including a semiconductor memory system in accordance with an embodiment of the present invention.

FIG. 10 is a block diagram schematically illustrating an electronic device 20000 including a memory controller 24000 and a semiconductor memory device 25000 in accordance with an embodiment of the present invention.

The memory controller 24000 and the semiconductor memory device 25000 may correspond to the memory controller 100 and the semiconductor memory device 200 described with reference to FIGS. 3 to 8b, respectively.

Referring to FIG. 10, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000, e.g., a flash memory device and a memory controller 24000 to control operations of the semiconductor memory device 25000.

The electronic device 20000 may include a processor 21000 to control overall operations of the electronic device 20000. The memory controller 24000 may be controlled by the processor 21000.

The processor 21000 may display data stored in the semiconductor memory device 25000 through a display 23000 according to an input signal from an input device 22000. For example, the input device 22000 may be implemented by a pointing device such as a touch pad or a computer mouse, a key pad, or a keyboard.

Figure 11:
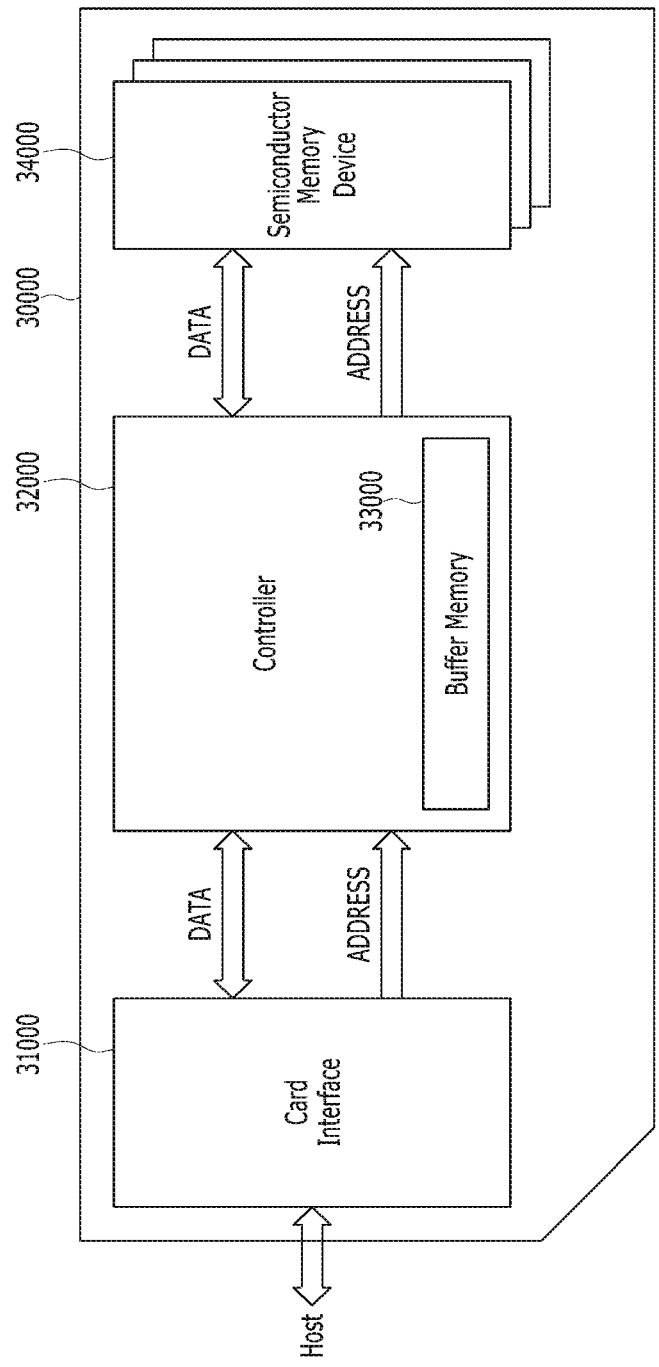
FIG. 11 is a block diagram schematically illustrating an electronic device including a semiconductor memory system in accordance with an embodiment of the present invention.

FIG. 11 is a block diagram schematically illustrating an electronic device 30000 including a controller 32000 and a semiconductor memory device 34000 in accordance with an embodiment of the present invention.

The controller 32000 and the semiconductor memory device 34000 may correspond to the memory controller 100 and the semiconductor memory device 200 described with reference to FIGS. 3 to 8b, respectively.

Referring to FIG. 11, the electronic device 30000 may include a card interface 31000, the controller 32000, and the semiconductor memory device 34000, for example, a flash memory device.

The electronic device 30000 may exchange data with a host through the card interface 31000. The card interface 31000 may be a secure digital (SD) card interface or a multi-media card (MMC) interface, which does not limit the scope of the present invention. The card interface 31000 may interface the host and the controller 32000 according to a communication protocol of the host capable of communicating with the electronic device 30000.

The controller 32000 may control an overall operation of the electronic device 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic device 30000 is connected with the host such as a PC, a tablet PC, a digital camera, a digital audio player, a mobile phone, console video game hardware or a digital set-top box, the host may exchange data with the semiconductor memory device 34000 through the card interface 31000 and the controller 32000.

Figure 12:
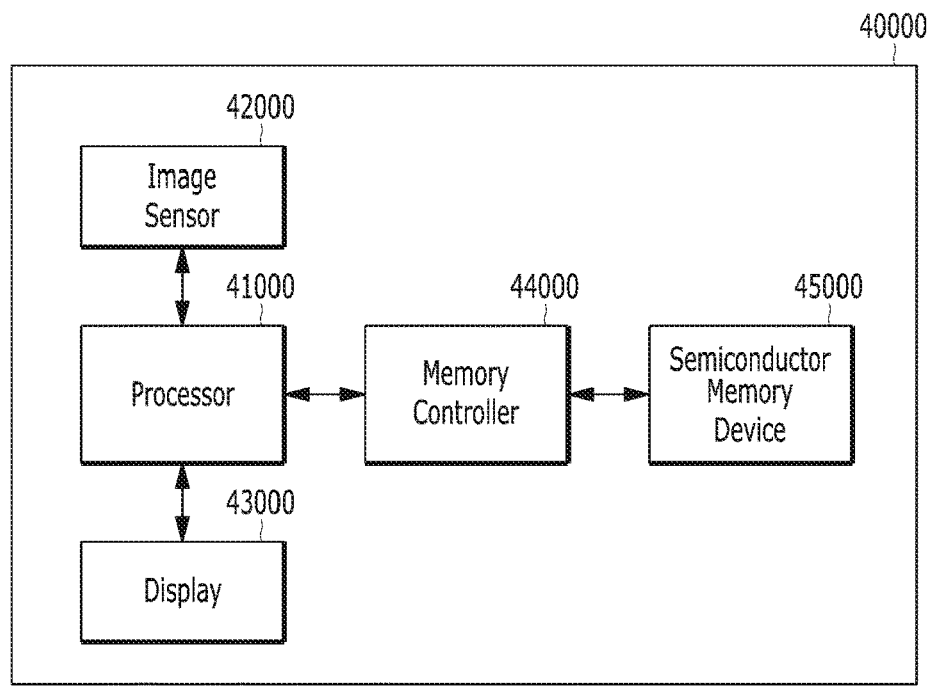
FIG. 12 is a block diagram schematically illustrating an electronic device including a semiconductor memory system in accordance with an embodiment of the present invention.

FIG. 12 is a block diagram schematically illustrating an electronic device 40000 including a memory controller 44000 and a semiconductor memory device 45000 in accordance with an embodiment of the present invention.

The memory controller 44000 and the semiconductor memory device 45000 may correspond to the memory controller 100 and the semiconductor memory device 200 described with reference to FIGS. 3 to 8b, respectively.

Referring to FIG. 12, the electronic device 40000 may include the semiconductor memory device 45000, e.g., the flash memory device, the memory controller 44000 to control a data processing operation of the semiconductor memory device 45000, and a processor 41000 to control overall operations of the electronic device 40000.

Further, an image sensor 42000 of the electronic device 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 13:
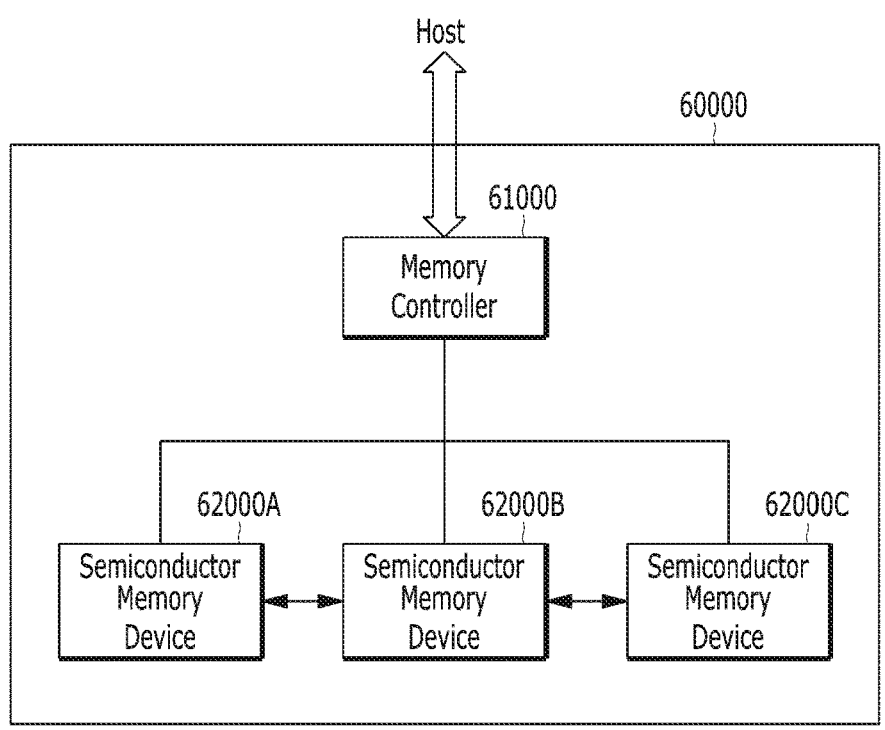
FIG. 13 is a block diagram schematically illustrating an electronic device including a semiconductor memory system in accordance with an embodiment of the present invention.

FIG. 13 is a block diagram schematically illustrating an electronic device 60000 including a memory controller 61000 and semiconductor memory devices 62000A, 62000B, and 62000C in accordance with an embodiment of the present invention.

The memory controller 61000 and each of the semiconductor memory devices 62000A, 62000B, and 62000C may correspond to the memory controller 100 and the semiconductor memory device 200 described with reference to FIGS. 3 to 8b, respectively.

Referring to FIG. 13, the electronic device 60000 may be implemented by a data storage device such as a solid state drive (SSD).

The electronic device 60000 may include the plurality of semiconductor memory devices 62000A, 62000B, and 62000C and the memory controller 61000 to control a data processing operation of each of the plural semiconductor memory devices 62000A, 62000B, and 62000C.

The electronic device 60000 may be implemented by a memory system or a memory module.

For example, the memory controller 61000 may be implemented outside or inside the electronic device 60000.

Figure 14:
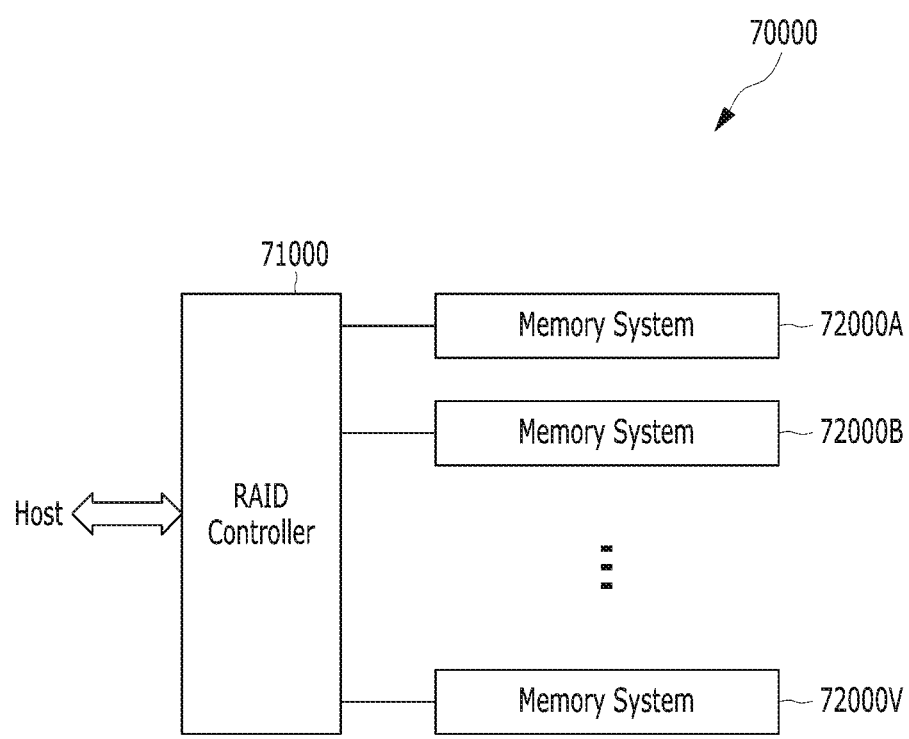
FIG. 14 is a block diagram of a data processing system including the electronic device shown in FIG. 13.

FIG. 14 is a block diagram of a data processing system including the electronic device 6000 described with reference to FIG. 13.

Referring to FIGS. 13 and 14, a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic device 60000 described with reference to FIG. 13. The memory systems 72000A to 72000N may form a RAID array. The data storage device 70000 may be implemented by an SSD.

During a program operation, the RAID controller 71000 may output program data, which is output from a host, to one of the memory systems 72000A to 72000N according to one selected from a plurality of RAID levels based on RAID level information output from the host.

During a read operation, the RAID controller 71000 may transfer data, which is read from one of the memory systems 72000A to 72000N, to the host according to one of the RAID levels based on the RAID level information output from the host.

While the present invention has been described with respect to the specific embodiments, it will be apparent to those skilled in the art that various changes and modifications may be made without departing from the spirit and scope of the invention as defined in the following claims.

What is claimed is:

1. An operating method of a controller, comprising:
generating, when a first ECC decoding operation to codeword read from a semiconductor memory device according to a hard read voltage fails, an optimization information corresponding the result of the first ECC decoding operation;
generating one or more quantization intervals determined by the optimization information; and
performing a second ECC decoding operation to codeword read from the semiconductor memory device according to soft read voltages determined by the quantization intervals and the hard read voltage,
wherein the optimization information includes:
deterioration information of a memory block;
ECC decoder parameter information; and
constituent code parameter information.

2. The operating method of claim 1,
wherein the first ECC decoding operation is a hard decision decoding operation, and
wherein the second ECC decoding operation is a soft decision decoding operation.

3. The operating method of claim 1, wherein the deterioration information of a memory block includes information of PIE cycle and data retention time of the memory block.

4. The operating method of claim 1, wherein the ECC decoder parameter information includes a chase decoding parameter.

5. The operating method of claim 1, wherein the constituent code parameter information includes information of length and error correction capability of a constituent BCH code.

6. The operating method of claim 1, wherein the generating of one or more quantization intervals is performed by generating the one or more quantization intervals by using the following equation based on the optimization information where the equation is as follows:

$$\Delta^i = \underset{\Delta^i}{\mathrm{argmax}} \Sigma_{r \in R} p(c \in C_c, r; \Delta^1, \ldots, \Delta^i) \cdot 1_{\Delta'(c, L(r)) \leq T_{ML}(r)}$$

wherein, "$\Delta^i$" represents a quantization interval pair, "i" represents an index of the quantization interval pair, "c" represents an error-corrected codeword, "$C_c$" represents a set of candidate codewords of a chase decoder, "r" represents a channel output of the constituent code, "$\Delta'(c', L(r))$" represents distance between a codeword and log likelihood ratio vector, "L" represents a channel output of a constituent code whose length is "n", and "$T_{ML}$" represents a threshold for determining reliability of the error-corrected codeword.

7. The operating method of claim 1, wherein the second ECC decoding operation is performed to the codeword read from the semiconductor memory device according to each of the soft read voltages respectively corresponding to the one or more quantization intervals.

8. The operating method of claim 7, wherein the second ECC decoding operation is performed to the codeword read from the semiconductor memory device according to each of the soft read voltages until the second ECC decoding operation succeeds or until an index representing the quantization intervals reaches its maximum value.

9. A controller comprising:
means for generating, when a first ECC decoding operation to codeword read from a semiconductor memory device according to a hard read voltage fails, an optimization information corresponding the result of the first ECC decoding operation;

means for generating one or more quantization intervals determined by the optimization information; and means for performing a second ECC decoding operation to codeword read from the semiconductor memory device according to soft read voltages determined by the quantization intervals and the hard read voltage, wherein the optimization information includes:

deterioration information of a memory block;

ECC decoder parameter information; and constituent code parameter information.

10. The controller of claim 9, wherein the first ECC decoding operation is a hard decision decoding operation, and wherein the second ECC decoding operation is a soft decision decoding operation.

11. The controller of claim 9, wherein the deterioration information of a memory block includes information of P/E cycle and data retention time of the memory block.

12. The controller of claim 9, wherein the ECC decoder parameter information includes a chase decoding parameter.

13. The controller of claim 9, wherein the constituent code parameter information includes information of length and error correction capability of a constituent BCH code.

14. The controller of claim 9, wherein the means for generating one or more quantization intervals generates the one or more quantization intervals by using the following equation based on the optimization information where the equation is as follows:

$$\Delta^i = \underset{\Delta^i}{\mathrm{argmax}} \Sigma_{r \in R} p(c \in C_c, r; \Delta^1, \ldots, \Delta^i) \cdot 1_{\Delta'(c,L(r)) \leq T_{ML}(r)}$$

wherein, "$\Delta^i$" represents a quantization interval pair, "i" represents an index of the quantization interval pair, "c" represents an error-corrected codeword, "$C_c$" represents a set of candidate codewords of a chase decoder, "r" represents a channel output of the constituent code, "$\Delta'(c', L(r))$" represents distance between a codeword and log likelihood ratio vector, "L" represents a channel output of a constituent code whose length is "n", and "$T_{ML}$" represents a threshold for determining reliability of the error-corrected codeword.

15. The controller of claim 9, wherein the means for performing the second ECC decoding operation performs the second ECC decoding operation to the codeword read from the semiconductor memory device according to each of the soft read voltages respectively corresponding to the one or more quantization intervals.

16. The operating method of claim 15, wherein the means for performing the second ECC decoding operation performs the second ECC decoding operation to the codeword read from the semiconductor memory device according to each of the soft read voltages until the second ECC decoding operation succeeds.

17. A semiconductor memory system comprising:

a semiconductor memory device; and a controller, wherein the controller includes:

means for generating, when a first ECC decoding operation to codeword read from a semiconductor memory device according to a hard read voltage fails, an optimization information corresponding the result of the first ECC decoding operation;

means for generating one or more quantization intervals determined by the optimization information; and means for performing a second ECC decoding operation to codeword read from the semiconductor memory device according to soft read voltages determined by the quantization intervals and the hard read voltage, and wherein the optimization information includes:

deterioration information of a memory block;

ECC decoder parameter information; and constituent code parameter information.

18. The semiconductor memory system of claim 17, wherein the first ECC decoding operation is a hard decision decoding operation, and wherein the second ECC decoding operation is a soft decision decoding operation.

19. The semiconductor memory system of claim 17, wherein the means for generating one or more quantization intervals generates the one or more quantization intervals by using the following equation based on the optimization information where the equation is as follows:

$$\Delta^i = \underset{\Delta^i}{\mathrm{argmax}} \Sigma_{r \in R} p(c \in C_c, r; \Delta^1, \ldots, \Delta^i) \cdot 1_{\Delta'(c,L(r)) \leq T_{ML}(r)}$$

wherein, "$\Delta^i$" represents a quantization interval pair, "i" represents an index of the quantization interval pair, "c" represents an error-corrected codeword, "$C_c$" represents a set of candidate codewords of a chase decoder, "r" represents a channel output of the constituent code, "$\Delta'(c', L(r))$" represents distance between a codeword and log likelihood ratio vector, "L" represents a channel output of a constituent code whose length is "n", and "$T_{ML}$" represents a threshold for determining reliability of the error-corrected codeword.

20. A memory system comprising:

memory blocks; and a controller suitable for:

generating, when a hard decision decoding operation to codeword read from the memory blocks according to a hard read voltage fails, an optimization information corresponding a result of the hard decision decoding operation;

generating one or more quantization intervals determined by the optimization information; and performing a soft decision decoding operation to codeword read from the memory blocks according to soft read voltages determined by the quantization intervals and the hard read voltage, wherein the optimization information includes:

information of P/E cycle and data retention time of the respective memory blocks;

a chase decoding parameter; and information of length and error correction capability of a constituent BCH code.

* * * * *